United States Patent [19]
Taniguchi

[11] Patent Number: 6,107,832
[45] Date of Patent: Aug. 22, 2000

[54] INPUT/OUTPUT CIRCUIT

[75] Inventor: Hideki Taniguchi, Tokyo, Japan

[73] Assignee: Mitsubishi Denki Kabushiki Kaisha, Tokyo, Japan

[21] Appl. No.: 09/322,167

[22] Filed: May 28, 1999

[30] Foreign Application Priority Data

Feb. 5, 1999 [JP] Japan .................................. 11-029082

[51] Int. Cl.[7] .......................................... H03K 19/0175
[52] U.S. Cl. ................................ 326/81; 326/58; 326/63; 326/83
[58] Field of Search ........................ 365/189.05, 189.11; 326/58, 57, 56, 63, 82, 83, 80, 81

[56] References Cited

U.S. PATENT DOCUMENTS

| | | | |
|---|---|---|---|
| 4,506,164 | 3/1985 | Higuchi | 307/264 |
| 5,239,214 | 8/1993 | Segawa et al. | 326/58 |
| 5,300,835 | 4/1994 | Assar et al. | 307/475 |
| 5,534,791 | 7/1996 | Mattos et al. | 326/27 |
| 5,812,461 | 9/1998 | Komarek et al. | 365/189.05 |
| 5,834,948 | 11/1998 | Yoshizaki et al. | 326/81 |
| 5,889,707 | 3/1999 | Yang | 365/189.05 |
| 5,952,847 | 9/1999 | Plants et al. | 326/80 |

FOREIGN PATENT DOCUMENTS

| | | |
|---|---|---|
| 5315931 | 11/1993 | Japan . |
| 5335504 | 12/1993 | Japan . |
| 8335126 | 12/1996 | Japan . |
| 9200024 | 7/1997 | Japan . |

*Primary Examiner*—Son Mai
*Attorney, Agent, or Firm*—Leydig, Voit & Mayer

[57] ABSTRACT

An input/output circuit in which, one of the two output signals from a signal level converting circuit is inputted into one input terminal of a NAND gate and into one input terminal of a NOR gate, while the other signal is inputted into the other input terminal of the NOR gate and also to the other input terminal of the NAND gate through an inverter. An output signal from the NAND gate and NOR gate is inputted into the gate of a PMOS transistor and into a gate of a NMOS transistor, which makes it possible to prevent the PMOS transistor and NMOS transistor from concurrently being ON and also prevents a through current from flowing therethrough.

3 Claims, 8 Drawing Sheets

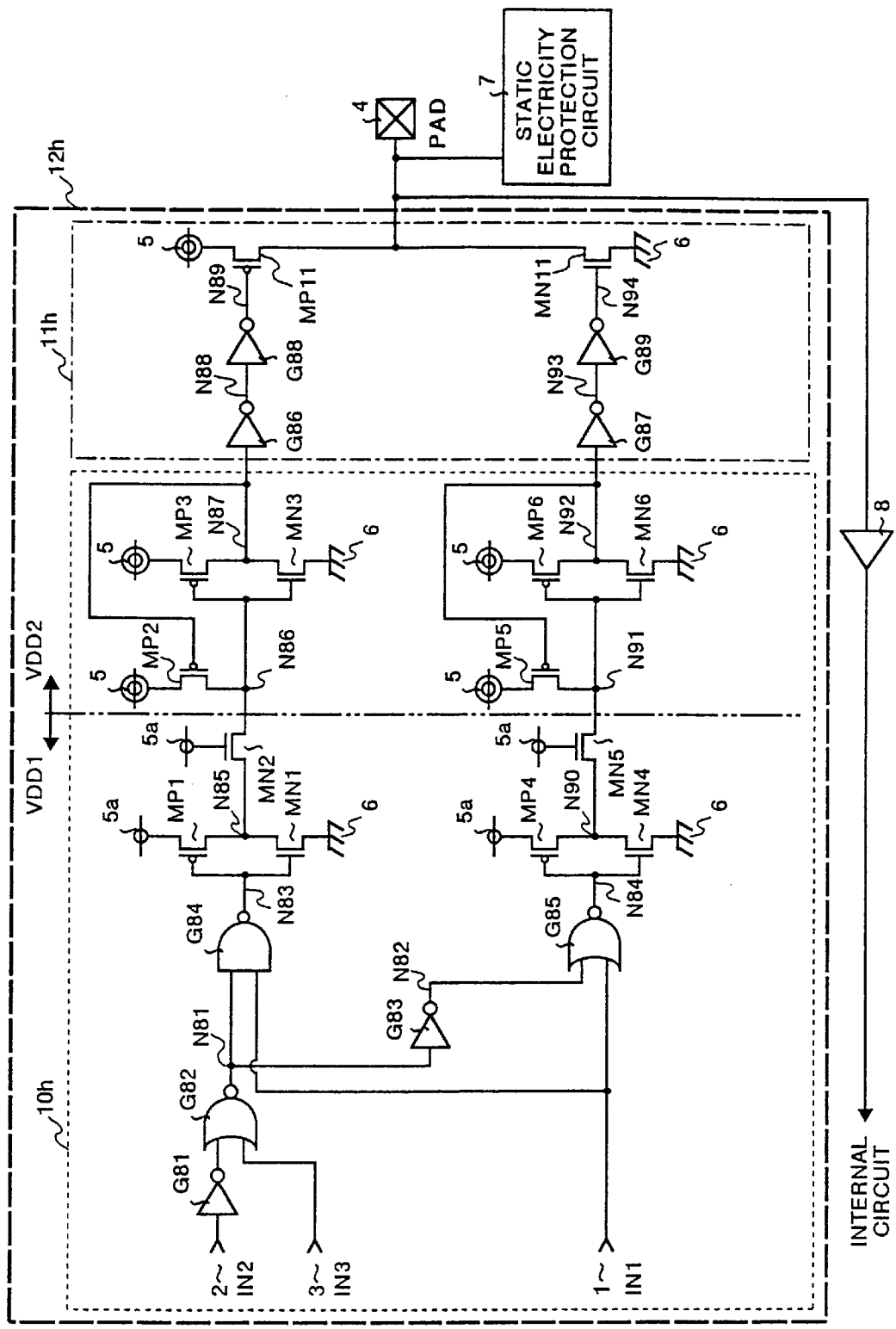

INPUT/OUTPUT CIRCUIT

FIELD OF THE INVENTION

The present invention relates to an input/output circuit having a complementary metal oxide semiconductor (CMOS) structure, and more specifically to an input/output circuit for voltage level conversion of signals between circuits, each driven with a different power supply voltage.

BACKGROUND OF THE INVENTION

Generally in the electronic computers which use a large scale integrated circuit device (described as LSI hereinafter), the circuits in the LSI and those outside the LSI (described as internal circuits and external circuits hereinafter, respectively) are driven by power supply voltages having different voltage levels. The LSI as described above has an input/output circuit having a function for converting a signal level. Namely, the input/output circuit having the signal level converting function has a function for converting a voltage level of a signal supplied from a device operating with a power supply voltage inside the LSI and outputting the signal to an external circuit operating with a power supply voltage different from that within the internal circuit, and a function for converting a voltage level of a signal supplied from a device operating with an external different power supply voltage to a signal level for the internal circuit and delivering the signal to the internal circuit.

FIG. 7 is a circuit diagram showing configuration of an input/output circuit based on the conventional technology as described above. This input/output circuit comprises an output buffer circuit 12g (a circuit section enclosed with a bold dashed line) having an input circuit section 10g (a circuit section enclosed with a dotted line) and an output circuit section 11g (a circuit section enclosed with a dot and dash line), and an input buffer circuit 8, and is connected to an input/output terminal (PAD) 4 used for signal transactions with an external circuit not shown herein and a static electricity protection circuit 7.

The input circuit section 10g comprises an input terminal 1 for receiving an output signal IN1 outputted from an internal circuit to an external circuit from the internal circuit; a first control terminal 2 for receiving a first control signal IN2 from the internal circuit; a second control terminal 3 for receiving a second control signal IN3 from the internal circuit; four inverters G71, G73, G76 and G77; two double-input NOR gates G72 and G75; a double-input NAND gate G74; four P-channel metal oxide semiconductor transistors (described as PMOS transistor hereinafter) MP1, MP2, MP3 and MP4; and four N-channel metal oxide semiconductor transistors (described as NMOS transistor hereinafter) MN1, MN2, MN3 and MN4. On the other hand, the output circuit section 11g comprises two inverters G78 and G79, a PMOS transistor MP11, and a NMOS transistor MN11.

In FIG. 7, the side of the internal circuit (left side in the figure) from the phantom line positioned substantially at the center is a circuit (described as VDD1 circuit hereinafter) driven by a first power supply potential VDD1 as a power supply voltage for the internal circuit, while the side of the external circuit (right side in the figure) from the phantom line is a circuit (described as VDD2 circuit hereinafter) driven by a second power supply potential VDD2 (>first power supply potential VDD1>ground potential GND).

Namely, the VDD1 circuit includes the input terminal 1; first control terminal 2; second control terminal 3; four inverters G71, G73, G76 and G77; two NOR gates G72 and G75; and NAND gate G74 in the input circuit section 10g; while the VDD2 circuit includes the four PMOS transistors MP1, MP2, MP3 and MP4; four NMOS transistors MN1, MN2, MN3 and MN4 in the input circuit section 10g; and the output circuit section 11g.

In FIG. 7, designated at 5 is a second power supply terminal for supplying the second power supply potential VDD2, at 6 a ground terminal for the ground potential GND; and at N71, N72, N73, N74, N75, N76, N77 and N78 are nodes.

The first control signal IN2 inputted from the internal circuit through the first control terminal 2 is inputted into a first input terminal of the NOR gate G72 through the inverter G71. While the second control signal IN3 inputted from the internal circuit through the second control terminal 3 is inputted into a second input terminal of the NOR gate G72. An output signal from this NOR gate G72 is inputted into a first input terminal of the NAND gate G74.

Inputted into a second input terminal of this NAND gate G74 is the output signal IN1 inputted from the internal circuit through the input terminal 1. Further, output signal from the NAND gate G74 is inputted into the gate of the first NMOS transistor MN1 through the inverter G76 and also into the gate of the second NMOS transistor MN2.

The first NMOS transistor MN1 and the first PMOS transistor MP1 constitute a CMOS structure, and their drains are connected to each other. The sources of the first PMOS transistor MP1 and the first NMOS transistor MN1 are connected to the second power supply 5 and the ground 6, respectively. The second NMOS transistor MN2 and the second PMOS transistor MP2 constitutes a CMOS structure, their drains are connected to each other, and the sources of the second PMOS transistor MP2 and the second NMOS transistor MN2 are connected to the second power supply terminal 5 and the ground terminal 6, respectively.

The drain of the first PMOS transistor MP1 is connected to the gate of the second PMOS transistor MP2. While the drain of the second PMOS transistor MP2 is connected to the gate of the first PMOS transistor MP1 and also connected to the output circuit section 11g through the node N75. A pair of CMOSs comprising those first and second PMOSs and NMOSs each constitutes a latch-type of signal level converting circuit for performing level conversion of a signal for the level of the first power supply potential VDD1 outputted from the LSI-internal circuit to a signal for the level of the second power supply potential VDD2.

On the other hand, an output signal from the NOR gate G72 is inputted into the first input terminal of the NOR gate G75 through the inverter G73, and the output signal IN1 having been inputted through the input terminal 1 is inputted into the second input terminal of the NOR gate G75. An output signal from this NOR gate G75 is inputted into the gate of the third NMOS transistor MN3 through the inverter G77 and also inputted into the gate of the fourth NMOS transistor MN4.

The third NMOS transistor MN3 and the third PMOS transistor MP3 constitute a CMOS structure, and their drains are connected to each other. The sources of the third PMOS transistor MP3 and the third NMOS transistor MN3 are connected to the second power supply terminal 5 and the ground terminal 6, respectively. The fourth NMOS transistor MN4 and the fourth PMOS transistor MP4 also constitutes a CMOS structure, their drains are connected to each other, and the source of the fourth PMOS transistor MP4 and the source of the fourth NMOS transistor MN4 are connected to the second power supply terminal 5 and the ground terminal 6, respectively.

The drain of the third PMOS transistor MP3 is connected to the gate of the fourth PMOS transistor MP4. While the drain of the fourth PMOS transistor MP4 is connected to the gate of the third PMOS transistor MP4 and also connected to the output circuit section 11g through the node N76. A pair of CMOSs each comprising those third and fourth PMOS and NMOS constitutes a latch-type of signal level converting circuit for performing level conversion of a signal for the level of the first power supply potential VDD1 outputted from the LSI-internal circuit to a signal for the level of the second power supply potential VDD2.

Each output from the drains of the second PMOS transistor MP2 and the fourth PMOS transistor MP4 is inputted into the gate of the PMOS transistor MP11 and the gate of the NMOS transistor MN11 respectively, both of which constitute a CMOS structure, through the inverter G78 and inverter G79, respectively, in the output circuit section 11g. Those sources of the PMOS transistor MP11 and the NMOS transistor MN11 are connected to the second power supply terminal 5 and the ground terminal 6, respectively. The drains of the PMOS transistor MP11 and the NMOS transistor MN11 are connected to each other and are further connected to the input/output terminal 4, the static electricity protection circuit 7, and the input buffer circuit 8.

Herein, each gate insulating film of the MOS transistors, constituting the five PMOS transistors MP1, MP2, MP3, MP4 and MP11, five NMOS transistors MN1, MN2, MN3, MN4 and MN11, and two inverters G78 and G79 in the output circuit section 11g, respectively, is formed so that each of the films is thicker than gate insulating film of MOS transistors each constituting the four inverters G71, G72, G76 and G77, two NOR gates G72 and G75, and NAND gate G74, respectively, by which occurrence of dielectric breakdown is prevented.

The input buffer circuit 8 is connected to an unillustrated internal circuit and comprises a circuit for converting a signal level from an external input signal indicating definition of HIGH as a relatively high potential level and LOW as a relatively low potential level by the second power supply potential VDD2 and the ground potential GND to a signal indicating definition of HIGH and LOW by the first power supply potential VDD1 and the ground potential GND; and an input driver circuit.

The static electricity protection circuit 7 operates so as to protect the input/output circuit from the static electricity, enters in a low impedance state when a high potential external input signal is received from the input/output terminal 4, and enters in a high impedance state when a low potential external input signal or an operation voltage is received therefrom. The static electricity protection circuit 7 is formed, for example, by combining resistors each using a junction diode, diffusion area, and a polysilicon layer on a semiconductor substrate.

Description is made for effects of the input/output circuit configured as shown in FIG. 7. This input/output circuit delivers a signal from the internal circuit in the LSI to a device outside the LSI while it is converting a signal level. Namely, the internal circuit in the LSI operates by a first power supply unit system with the first power supply potential VDD1 and the ground potential GND supplied thereto, and supplies a signal supplied from the internal circuit thereof, of which the level is converted, to a device outside the LSI operated by a second power supply unit system with the second power supply potential VDD2 and the ground potential GND supplied thereto. This operation will be described separately in an input mode and an output mode.

[Input Mode]

When the first control signal IN2 is LOW (L), the signal for HIGH (H) obtained through inversion thereof by the inverter G71 is inputted into the NOR gate G72. The output from the NOR gate G72 (namely, potential at the node N71 and input into the NAND gate G74) is always LOW regardless of the level of the second control signal IN3. The output from the NAND gate G74 (namely, potential at the node N73) is always HIGH regardless of the level of the output signal IN1, and this level is inverted to be LOW by the inverter G76.

Accordingly, the first NMOS transistor MN1 becomes OFF, the second NMOS transistor MN2 becomes ON, the first PMOS transistor MP1 becomes ON and the second PMOS transistor MP2 becomes OFF, and the input into the inverter G78 (the potential of the node N75) is LOW. This LOW level is inverted by the inverter G78, and as the output (namely, potential at the node N77) therefrom becomes HIGH the PMOS transistor MP11 in the output circuit section 11g becomes OFF.

On the other hand, as the potential level of the node N71 is inverted by the inverter G73, the input into the NOR gate G75 (namely, potential at the node N72) is HIGH. The output from the NOR gate G75 (namely, potential at the node N74) is always LOW regardless of the level of the output signal IN1, and this level is inverted to HIGH by the inverter G77.

Accordingly, the third NMOS transistor MN3 becomes OFF and the fourth NMOS transistor MN4 becomes ON, further the fourth PMOS transistor MP4 becomes OFF and the third PMOS transistor MP3 becomes ON, and the input into the inverter G79 (namely, potential at the node N76) is HIGH. This level is inverted by the inverter G79, and as the output (namely, potential at the node N78) therefrom becomes LOW the NMOS transistor MN11 in the output circuit section 11g becomes OFF.

Accordingly, the output buffer circuit 12g enters in a high impedance state with respect to the input/output terminal 4. Therefore, a signal sent from an external device to the input/output terminal 4 can be delivered to the input buffer circuit 8 without loss.

When the second control signal IN3 is HIGH, the potential at the node N71 is always LOW regardless of the level of the first control signal IN2. This state is the same as that when the first control signal IN2 is LOW, and therefore both the PMOS transistor MP11 and the NMOS transistor MN11 in the output circuit section 11g are turned OFF regardless of the level of the output signal IN1. Accordingly, the output buffer circuit 12g enters in a high impedance state with respect to the input/output terminal 4, so that a signal sent from an external device to the input/output terminal 4 can be delivered to the input buffer circuit 8 without loss.

[Output Mode]

When the first control signal IN2 is at HIGH level, a LOW level signal obtained through inversion thereof by the inverter G71 is inputted into the NOR gate G72. When the second control signal IN3 as the other input signal into the NOR gate G72 is at LOW level, the output from the NOR gate G72 is HIGH, and is inputted into one of the input terminals of the NAND gate G74 as it is, and also inverted to LOW by the inverter G73 to be inputted into one of the input terminals of the NOR gate G75.

When the output signal IN1 is at LOW level, the output from the NAND gate G74, namely the node N73 is HIGH, and this state is the same as that in the case of input mode described above, and hence the PMOS transistor MP11 in the output circuit section 11g becomes OFF.

At that point of time, the output from the NOR gate G75, namely the node N74 enters HIGH, which is inverted to LOW by the inverter G77. Accordingly, the fourth NMOS transistor MN4 becomes ON and the third NMOS transistor MN3 becomes OFF, further the fourth PMOS transistor MP4 becomes OFF and the third PMOS transistor MP3 becomes ON, and the input into the inverter G79 is LOW. As this level is inverted by the inverter G79 to HIGH, the NMOS transistor MN11 in the output circuit section 11g becomes ON, and the LOW level signal is outputted to the input/output terminal 4.

When the first control signal IN2 is HIGH, the second control signal IN3 is LOW and the output signal IN1 is HIGH, two inputs into the NOR gate G75 are LOW and HIGH, so that output from the NOR gate G75, namely the node N74 is LOW, which is the same as that in the case of input mode described above, and hence the NMOS transistor MN11 in the output circuit section 11g becomes OFF.

At that point of time, the output from the NAND gate G74, namely the node N73 enters LOW, which is inverted to HIGH by the inverter G76. Accordingly, the first NMOS transistor MN1 becomes ON and the second NMOS transistor MN2 becomes OFF, further the first PMOS transistor MP1 becomes OFF and the second PMOS transistor MP2 becomes ON, and the input into the inverter G78 is HIGH. As this level is inverted by the inverter G78 to LOW, the PMOS transistor MP11 in the output circuit section 11g becomes ON, and the HIGH level signal is outputted to the input/output terminal 4.

FIG. 8 is a circuit diagram showing another configuration of the input/output circuit based on the conventional technology. This input/output circuit comprises an output buffer circuit 12h (a circuit section enclosed with a bold dashed line) having an input circuit section 10h (a circuit section enclosed with a dotted line) and an output circuit section 11h (a circuit section enclosed with a dot and dash line), and an input buffer circuit 8, and is connected to an input/output terminal (PAD) 4 and a static electricity protection circuit 7 similarly to the circuit of FIG. 7. The input/output terminal 4, static electricity protection circuit 7, and input buffer circuit 8 are the same as those having been described in the example based on the conventional technology shown in FIG. 7, and description thereof is omitted herein.

The input circuit section 10h comprises an input terminal 1 for receiving an output signal IN1; a first control terminal 2 for receiving a first control signal IN2; a second control terminal 3 for receiving a second control signal IN3; two inverters G81 and G83; two double-input NOR gates G82 and G85; a double-input NAND gate G84; six PMOS transistors MP1, MP2, MP3, MP4, MP5 and MP6; and six NMOS transistors MN1, MN2, MN3, MN4, MN5 and MN6. On the other hand, the output circuit section 11h comprises four inverters G86, G87, G88 and G89, a PMOS transistor MP11, and a NMOS transistor MN11.

In the example shown in FIG. 8, the VDD1 circuit driven by the first power supply potential VDD1 includes the input terminal 1; first control terminal 2; second control terminal 3; two inverters G81 and G83; two NOR gates G82 and G85; NAND gate G84; two PMOS transistors MP1 and MP4; and four NMOS transistors MN1, MN2, MN4 and MN5 each in the input circuit section 10h. On the other hand, the VDD2 circuit driven by the second power supply potential VDD2 (>VDD1>GND) includes the four PMOS transistors MP2, MP3, MP5 and MP6; two NMOS transistors MN3 and MN6 each in the input circuit section 10h; and the output circuit section 11h.

In FIG. 8, designated at 5a is a first power supply terminal for supplying the first power supply potential VDD1, at 5 a second power supply terminal for supplying the second power supply potential VDD2, at 6 a ground terminal for the ground potential GND; and at N81, N82, N83, N84, N85, N86, N87, N88, N89, N90, N91, N92, N93 and N94 are nodes.

The first control signal IN2 inputted from the internal circuit through the first control terminal 2 is inputted into a first input terminal of the NOR gate G82 through the inverter G81. While the second control signal IN3 inputted from the internal circuit through the second control terminal 3 is inputted into a second input terminal of the NOR gate G82. Output signal from this NOR gate G82 is inputted into a first input terminal of the NAND gate G84.

Inputted into a second input terminal of this NAND gate G84 is the output signal IN1 through the input terminal 1. Further, output signal from the NAND gate G84 is inputted into the gates of the first PMOS transistor MP1 and first NMOS transistor MN1.

The first PMOS transistor MP1 and the first NMOS transistor MN1 constitute a CMOS structure, and their drains are commonly connected to the source of the second NMOS transistor MN2. The sources of the first PMOS transistor MP1 and the first NMOS transistor MN1 are connected to the first power supply terminal 5a and the ground terminal 6 respectively. The gate of the second NMOS transistor MN2 is connected to the first power supply terminal 5a, and the drain thereof together with the drain of the second PMOS transistor MP2 is connected to the commonly connected gates of the third PMOS transistor MP3 and the third NMOS transistor MN3.

The source of the second PMOS transistor MP2 is connected to the second power supply terminal 5, and the gate thereof is connected to the commonly connected drains of the third PMOS transistor MP3 and the third NMOS transistor MN3, and also to the output circuit section 11h. The third PMOS transistor MP3 and the third NMOS transistor MN3 constitute a CMOS structure, and their sources thereof are connected to the second power supply terminal 5 and the ground terminal 6 respectively. A set of transistors with those MP1, MP2, MP3, MN1, MN2 and MN3 constitutes a signal level converting circuit.

On the other hand, an output signal from the NOR gate G82 is inputted into the first input terminal of the NOR gate G85 through the inverter G83, and the output signal IN1 is inputted into the second input terminal of the NOR gate G85. Output signal from this NOR gate G85 is inputted into gates of the fourth PMOS transistor MP4 and the fourth NMOS transistor MN4.

The fourth PMOS transistor MP4 and the fourth NMOS transistor MN4 constitute a CMOS structure, and their drains are commonly connected to the source of the fifth NMOS transistor MN5. The sources of the fourth PMOS transistor MP4 and the fourth NMOS transistor MN4 are connected to the first power supply terminal 5a and the ground terminal 6 respectively. The gate of the fifth NMOS transistor MN5 is connected to the first power supply terminal 5a, and the drain thereof together with the drain of the fifth PMOS transistor MP5 is connected to the commonly connected gates of the sixth PMOS transistor MP6 and the sixth NMOS transistor MN6.

The source of the fifth PMOS transistor MP5 is connected to the second power supply terminal 5, and the gate is connected to the commonly connected drains of the sixth PMOS transistor MP6 and the sixth NMOS transistor MN6, and also to the output circuit section 11h. The sixth PMOS transistor MP6 and the sixth NMOS transistor MN6 constitute a CMOS structure, and their sources are connected to the second power supply terminal 5 and the ground terminal 6 respectively. A set of transistors with those MP4, MP5, MP6, MN4, MN5 and MP6 constitutes a signal level converting circuit.

Output from the CMOS transistor comprising the third PMOS and NMOS transistors and output from the CMOS transistor comprising the sixth PMOS and NMOS transistors are inputted into each gate of the PMOS transistor MP11 and the NMOS transistor MN11 which constitute a CMOS structure through the inverters G86, G88 and the inverters G87, G89 respectively. Source terminals of the PMOS transistor MP11 and the NMOS transistor MN11 are connected to the second power supply terminal 5 and the ground terminal 6 respectively. The commonly connected drains of the PMOS transistor MP11 and the NMOS transistor MN11 are connected to the input/output terminal 4, static electricity protection circuit 7, and input buffer circuit 8.

Herein, each gate insulating film of MOS transistors constituting the five PMOS transistors MP2, MP3, MP5, MP6 and MP11, three NMOS transistors MN3, MN6 and MN11, and four inverters G86, G87, G88 and G89 in the output circuit section 11$h$ respectively is formed so that each of the films is thicker than each gate insulating film of MOS transistors each constituting the two PMOS transistors MP1 and MP4, four NMOS transistors MN1, MN2, MN4 and MN5, two inverters G81 and G82, two NOR gates G82 and G85, and NAND gate G84 respectively, with which occurrence of dielectric breakdown is prevented.

Description is made for effects of the input/output circuit configured as shown in FIG. 8 separately in an input mode and an output mode thereof.

[Input Mode]

When the first control signal IN2 is at LOW level, the HIGH level signal obtained through inversion thereof by the inverter G81 is inputted into the NOR gate G82. The output from the NOR gate G82 (namely, potential at the node N81 and input into the NAND gate G84) is always LOW regardless of the level of the second control signal IN3. Then the output from the NAND gate G84 (namely, potential at the node N83) is always HIGH regardless of the level by the output signal IN1.

Accordingly, the first PMOS transistor MP1 becomes OFF and the first NMOS transistor MN1 becomes ON, and the third PMOS transistor MP3 becomes ON and the third NMOS transistor MN3 becomes OFF because input into the gates thereof is LOW. Thus, the output (namely, potential at the node N87) therefrom is HIGH and input into the gate of the PMOS transistor MP11 in the output circuit section 11$h$ is HIGH, so that the PMOS transistor MP11 becomes OFF.

On the other hand, as the potential level at the node N81 is inverted by the inverter G83, the input into the NOR gate G85 (namely, potential at the node N82) is at HIGH level. The output from the NOR gate G85 (namely, potential at the node N84) is always LOW regardless of the level of the output signal IN1.

Accordingly, the fourth PMOS transistor MP4 becomes ON and the fourth NMOS transistor MN4 becomes OFF, and the sixth PMOS transistor MP6 becomes OFF and the sixth NMOS transistor MN6 becomes ON because input into the gates thereof is at HIGH level. Thus, the output (namely, potential at the node N92) therefrom is LOW and input into the gate of the NMOS transistor MN11 in the output circuit section 11$h$ is LOW, so that the NMOS transistor MN11 also becomes OFF.

Accordingly, the output buffer circuit 12$h$ enters in a high impedance state with respect to the input/output terminal 4. Therefore, a signal sent from an external device to the input/output terminal 4 can be delivered to the input buffer circuit 8 without loss.

When the second control signal IN3 is at HIGH level, the potential at the node N81 is always at a LOW level regardless of the level of the first control signal IN2. This state is the same as that when the first control signal IN2 is LOW, and hence both the PMOS transistor MP11 and the NMOS transistor MN11 in the output circuit section 11$h$ becomes OFF regardless of the level of the output signal IN1. Accordingly, the output buffer circuit 12$h$ enters in a high impedance state with respect to the input/output terminal 4, so that a signal sent from an external device to the input/output terminal 4 can be delivered to the input buffer circuit 8 without loss.

[Output Mode]

When the first control signal IN2 is at HIGH level, the LOW level signal obtained through inversion thereof by the inverter G81 is inputted into the NOR gate G82. When the second control signal IN3 is at LOW level, the output from the NOR gate G82 is at HIGH level, and is inputted into one of the input terminals of the NAND gate G84 as it is, and also inverted to a LOW level by the inverter G83 to be inputted into one of the input terminals of the NOR gate G85.

When the output signal IN1 is at LOW level, the output from the NAND gate G84, namely the node N83 is HIGH, and this state is the same as that in the case of input mode described above, and hence the PMOS transistor MP11 in the output circuit section 11$h$ becomes OFF.

At that point of time, output from the NOR gate G85, namely the node N84 enters HIGH, and the fourth PMOS transistor MP4 becomes OFF and the fourth NMOS transistor MN4 becomes ON, and the sixth PMOS transistor MP6 becomes ON and the sixth NMOS transistor MN6 becomes OFF because input into the gates thereof is at LOW level. Thus, the output (namely, potential at the node N92) therefrom is at HIGH level and input into the gate of the NMOS transistor MN11 in the output circuit section 11$h$ is HIGH, so that the NMOS transistor MN11 becomes ON, and the LOW level signal is outputted to the input/output terminal 4.

When the first control signal IN2 and second control signal IN3 are at HIGH and LOW level respectively and the output signal IN1 is at HIGH level, two inputs into the NOR gate G85 are at LOW and HIGH level, so that output from the NOR gate G85, namely the node N84 is LOW, which is the same as that in the case of input mode described above, and hence the NMOS transistor MN11 in the output circuit section 11$h$ becomes OFF.

At that point of time, output from the NAND gate G84, namely the node N83 enters LOW, the first PMOS transistor MP1 becomes ON and the first NMOS transistor MN1 becomes OFF, and the third PMOS transistor MP3 becomes OFF and the third NMOS transistor MN3 becomes ON because input into the gates thereof is at HIGH level. Thus, the output (namely, potential at the node N87) therefrom is LOW and input into the gate of the PMOS transistor MP11 in the output circuit section 11$h$ is at LOW level, so that the PMOS transistor MP11 becomes ON, and the HIGH level signal is outputted to the input/output terminal 4.

In the conventional type of input/output circuit as described above, when both the first power supply potential VDD1 and second power supply potential VDD2 are supplied thereto and an ordinary input/output operation is performed, potential levels of the node N75 and node N76 in the signal level converting circuit for the circuit shown in FIG. 7 are any of the combinations of HIGH and HIGH, LOW and LOW, and LOW and HIGH respectively. In the circuit shown in FIG. 8, potential levels of the node N87 and node N92 in the signal level converting circuit are any of the combinations of HIGH and HIGH, LOW and LOW, and HIGH and LOW respectively.

However, when the first power supply potential VDD1 is not ON in the initial state when the second power supply potential VDD2 is just turned ON, output from the circuit operating by the first power supply potential VDD1, namely from the VDD1 circuit is unstable and potential level in each section of the signal level converting circuit is not uniformly stabilized. For example, in the circuit shown in FIG. 7, potential levels of the node N75 and node 76 which are the two output terminals of the signal level converting circuit may become HIGH and LOW respectively.

Further, in the circuit shown in FIG. 8, potential levels of the node N87 and node 92 which are the two output terminals of the signal level converting circuit may become LOW and HIGH respectively. In such cases, there may arise a problem that the PMOS transistor MP11 and NMOS transistor MN11 provided at the final stage for output are concurrently turned ON, which causes an abnormal through current to flow between the second power supply 5 and ground 6 in the output buffer circuits 12g and 12h.

SUMMARY OF THE INVENTION

It is an object of the present invention to obtain, for the purpose of solving the problem as described above, an input/output circuit, for converting a voltage level of a signal transacted between circuits driven by power supply voltages for two different potential levels, in which an abnormal through current can be prevented from flowing.

In accordance with the present invention, when a second signal outputted from a signal level converting circuit is HIGH, outputs from a NAND gate and a NOR gate become HIGH and LOW respectively regardless of a potential level of a first signal outputted from the signal level converting circuit, and both a first output element and a second output element have a high impedance. When the second signal is LOW and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level.

In accordance with the present invention, when at least one of a second signal and a third signal outputted from a signal level converting circuit is LOW, outputs from a NAND gate and a NOR gate are HIGH and LOW respectively regardless of a potential level of a first signal outputted from the signal level converting circuit, and both a first output element and a second output element have a high impedance. When both the second signal and third signal are HIGH and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level.

In accordance with the present invention, when at least one of a second signal and third signal outputted from a signal level converting circuit is HIGH, outputs from a NAND gate and a NOR gate are HIGH and LOW respectively regardless of a potential level of a first signal outputted from the signal level converting circuit, and both a first output element and a second output element have a high impedance. When both the second signal and third signal are LOW and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level.

In accordance with the present invention, when a second signal from a signal level converting circuit is HIGH, namely when a third signal is LOW, outputs from a NAND gate and a NOR gate are HIGH and LOW respectively regardless of a potential level of a first signal outputted from the signal level converting circuit, and both a first output element and a second output element enter a high impedance. When the second signal is LOW, namely when the third signal is HIGH, and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level.

Other objects and features of this invention will become apparent from the following description with reference to the accompanying drawings.

BRIEF DESCRIPTION OF THE DRAWINGS

FIG. 8 is a circuit diagram showing another configuration of an input/output circuit based on the conventional technology.

DESCRIPTION OF THE PREFERRED EMBODIMENTS

Detailed description is made hereinafter for preferred embodiments of the input/output circuit according to the present invention with reference to the related drawings.

Figure 1:
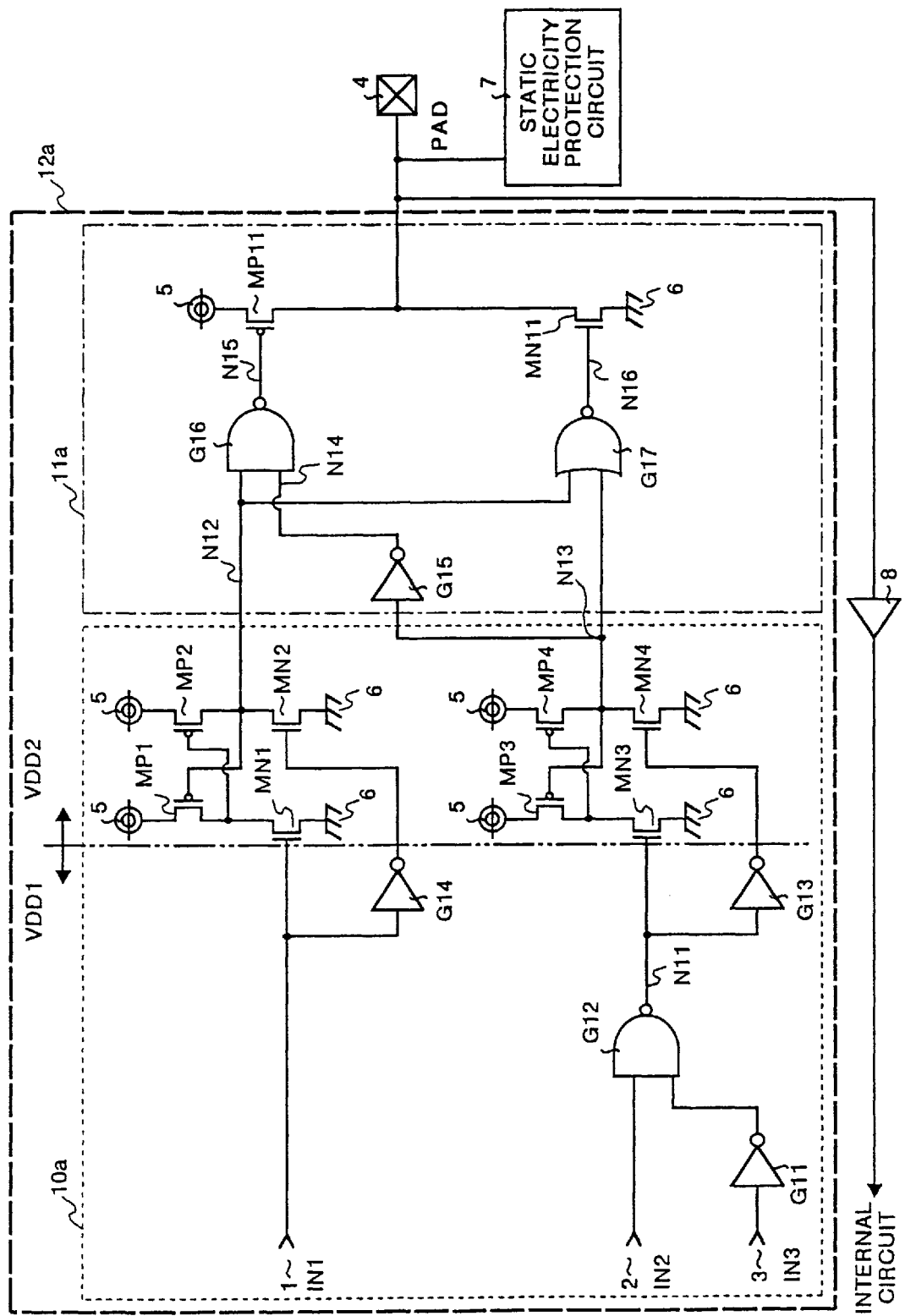
FIG. 1 is a circuit diagram showing Embodiment 1 of the input/output circuit according to the present invention.

FIG. 1 is a circuit diagram showing Embodiment 1 of the input/output circuit according to the present invention. This input/output circuit comprises an output buffer circuit 12a (a circuit section enclosed with a bold dashed line) having an input circuit section 10a (a circuit section enclosed with a dotted line) and an output circuit section 11a (a circuit section enclosed with a dot and dash line), and an input buffer circuit 8, and is connected to an input/output terminal (PAD) 4 used for signal transactions with an external circuit not shown herein and a static electricity protection circuit 7.

The input circuit section 10a comprises an input terminal 1 for receiving an output signal IN1 outputted from an internal circuit not shown herein to an external circuit from the internal circuit; a first control terminal 2 for receiving a first control signal IN2 from the internal circuit; a second control terminal 3 for receiving a second control signal IN3 from the internal circuit; three inverters G11, G13, G14; a double-input NAND gate G12; four PMOS transistors MP1, MP2, MP3 and MP4; and four NMOS transistors MN1, MN2, MN3 and MN4. On the other hand, the output circuit section 11a comprises an inverter G15, a double-input NAND gate G16; a double-input NOR gate G17; a PMOS transistor MP11, and an NMOS transistor MN11.

In FIG. 1, the side of the internal circuit (left side in the figure) from the phantom line positioned substantially at the center is a VDD1 circuit driven by a first power supply potential VDD1 as a power supply voltage for the internal circuit, while the side of the external circuit (right side in the figure) from the phantom line is a VDD2 circuit driven by a second power supply potential VDD2 at a higher potential level than that of the first power supply potential VDD1 (the same condition is also applied in FIG. 2 to FIG. 6). Namely, the VDD1 circuit includes the input terminal 1; first control terminal 2; second control terminal 3; three inverters G11, G13, G14; and NAND gate G12 each in the input circuit section 10a, while the VDD2 circuit includes the four PMOS transistors MP1, MP2, MP3 and MP4; four NMOS transistors MN1, MN2, MN3 and MN4 each in the input circuit section 10a; and the output circuit section 11a.

The relation between the two power supply potentials VDD1, VDD2 and the ground potential GND is VDD2>VDD1>GND. In FIG. 1, designated at 5 is a second power supply terminal for the second power supply potential VDD2, at 6 a ground terminal for the ground potential GND; and at N11, N12, N13, N14, N15 and N16 are nodes.

An output signal IN1 having been inputted through the input terminal 1 is inputted into the gate of the first NMOS transistor MN1 and into the gate of the second NMOS transistor MN2.

The first NMOS transistor MN1 and the first PMOS transistor MP1 constitute a CMOS structure, and their drains are connected to each other. The sources of the first PMOS transistor MP1 and the first NMOS transistor MN1 are connected to the second power supply terminal 5 and the ground terminal 6, respectively. The second NMOS transistor MN2 and the second PMOS transistor MP2 also constitute a CMOS structure, their drains are connected to each other, and the sources of the second PMOS transistor MP2 and the second NMOS transistor MN2 are connected to the second power supply terminal 5 and the ground terminal 6 respectively.

The drain of the first PMOS transistor MP1 is connected to the gate of the second PMOS transistor MP2. While the drain of the second PMOS transistor MP2 is connected to the gate of the first PMOS transistor MP1 and also connected to the output circuit section 11a. A pair of CMOSs comprising those first and second PMOSs and NMOSs each constitutes a latch-type of signal level converting circuit for performing level conversion of a signal for the level of the first power supply potential VDD1 outputted from the LSI-internal circuit to a signal for the level of the second power supply potential VDD2.

On the other hand, the first control signal IN2 inputted from the internal circuit through the first control terminal 2 is inputted into the first input terminal of the NAND gate G12. While the second control signal IN3 inputted from the internal circuit through the second control terminal 3 is inputted into the second input terminal of the NAND gate G12. Output signal from this NAND gate G12 is inputted into the gate of the third NMOS transistor MN3 and also inputted into the gate of the fourth NMOS transistor MN4.

The third NMOS transistor MN3 and the third PMOS transistor MP3 constitute a CMOS structure, and their drains are connected to each other. The sources of the third PMOS transistor MP3 and the third NMOS transistor MN3 are connected to the second power supply terminal 5 and the ground terminal 6 respectively.

The fourth NMOS transistor MN4 and the fourth PMOS transistor MP4 also constitute a CMOS structure, their drain are connected to each other, and the sources of the fourth PMOS transistor MP4 and the fourth NMOS transistor MN4 are connected to the second power supply terminal 5 and the ground terminal 6 respectively.

The drain of the third PMOS transistor MP3 is connected to the gate of the fourth PMOS transistor MP4. While the drain of the fourth PMOS transistor MP4 is connected to the gate of the third PMOS transistor MP3 and also connected to the output circuit section 11a. A pair of CMOSs comprising those third and fourth PMOSs and NMOSs each also constitutes a latch-type of signal level converting circuit for performing level conversion of a signal for the level of the first power supply potential VDD1 outputted from the LSI-internal circuit to a signal for the level of the second power supply potential VDD2.

In the output circuit section 11a, output from the drain of the second PMOS transistor MP2 (or the second NMOS transistor MN2) is inputted into the first input terminals of the NAND gate G16 and NOR gate G17. Output from the drain of the fourth PMOS transistor MP4 (or the fourth NMOS transistor MN4) is inputted into the second input terminal of the NAND gate G16 and also into the second input terminal of the NOR gate g17.

Output signals from the NAND gate G74 and NOR gate G17 are inputted, for example, into the gates of the PMOS transistor MP11 and NMOS transistor MN11 which constitute a CMOS structure. The sources of these PMOS transistor MP11 and NMOS transistor MN11 are connected to the second power supply terminal 5 and the ground terminal 6 respectively.

The commonly connected drains of the PMOS transistor MP11 and the NMOS transistor MN11 are connected to the input/output terminal 4, static electricity protection circuit 7, and input buffer circuit 8. Namely, the PMOS transistor MP11 and the NMOS transistor MN11 are the first output element and the second output element respectively which constitute the final stage for output.

Herein, each gate insulating film of MOS transistors each constituting the five PMOS transistors MP1, MP2, MP3, MP4 and MP11, five NMOS transistors MN1, MN2, MN3, MN4 and MN11, and the inverter G15, NAND gate G16 and NOR gate G17 in the output circuit section 11a respectively is formed so that each of the films is thicker than each gate insulating film of MOS transistors each constituting the three inverters G11, G13 and G14, and NAND gate G12 respectively, with which occurrence of dielectric breakdown is prevented.

The input buffer circuit 8 and static electricity protection circuit 7 have the same configuration and the same functions as those based on the conventional technology. Therefore, detailed description thereof is omitted herein.

Next, description is made for the effects of the input/output circuit configured as shown in FIG. 1. This input/ output circuit delivers a signal from the internal circuit in the LSI to a device outside the LSI while it is converting a signal level. Namely, the internal circuit in the LSI operates by a first power supply unit system with the first power supply potential VDD1 and the ground potential GND supplied thereto, and supplies a signal supplied from the internal circuit thereof, of which level is converted, to a device outside the LSI operating by a second power supply unit system with the second power supply potential VDD2 and the ground potential GND supplied thereto. This operation will be described separately in an input mode and an output mode.

[Input Mode]

When the first control signal IN2 is at LOW level, output from the NAND gate G12 (namely, potential at the node N11) is always at HIGH level regardless of the level of the second control signal IN3. Accordingly, the third NMOS transistor MN3 becomes ON and the fourth NMOS transistor MN4 becomes OFF, and the third PMOS transistor MP3 becomes OFF and the fourth PMOS transistor MP4 becomes ON, and hence output from the drain (namely, potential at the node N13) of the fourth PMOS transistor MP4 which is one of output signals to the output circuit section 11a becomes HIGH.

The input level of one input terminal of the NOR gate G17 becomes HIGH, so that the output therefrom (namely, potential at the node N16) becomes LOW, and the NMOS transistor MN11 in the output circuit section 11a becomes OFF with the above output being inputted into the gate thereof.

On the other hand, the potential at the node N13 is at HIGH level, which is inverted to LOW level by the inverter G15. Accordingly, one input (namely, potential at the node N14) into the NAND gate G16 is at LOW level, so that the output therefrom (namely, potential at the node N15) is HIGH level, and the PMOS transistor MP11 in the output circuit section 11a becomes OFF with the above output being inputted into the gate thereof.

Thus, the output buffer circuit 12a enters in a high impedance state with respect to the input/output terminal 4. Therefore, a signal sent from an external device to the input/output terminal 4 can be delivered to the input buffer circuit 8 without loss.

When the second control signal IN3 is at HIGH level, the signal is inverted to LOW level by the inverter G11 and inputted into the NAND gate G12, so that the potential at the node N11 is always at LOW level regardless of the level of the first control signal IN2.

This state is the same as that when the first control signal IN2 is at LOW level, and hence both the PMOS transistor MP11 and the NMOS transistor MN11 in the output circuit section 11a become OFF regardless of the level of the output signal IN1. Accordingly, the output buffer circuit 12a enters in a high impedance state with respect to the input/output terminal 4, so that a signal sent from an external device to the input/output terminal 4 can be delivered to the input buffer circuit 8 without loss.

[Output Mode]

When the first control signal IN2 is at HIGH level and the second control signal IN3 is at LOW level, the LOW level signal is inverted by the inverter G11, and so both the inputs into the NAND gate G12 are HIGH level, so that output therefrom, namely the potential at the node N11 becomes LOW level. Accordingly, the third NMOS transistor MN3 becomes OFF because the input into the gate thereof is at LOW level.

On the other hand, as the potential level at the node N11 is inverted by the inverter G13, the fourth NMOS transistor MN4 becomes ON because the input into the gate thereof is at HIGH level. At that point of time, the third PMOS transistor MP3 becomes ON and the fourth PMOS transistor MP4 becomes OFF. Therefore, the potential at the node N13 becomes LOW.

Accordingly, in the output circuit section 11a one input into the NOR gate G17 is at LOW level. One input into the NAND gate G16 (namely, potential at the node N14) becomes HIGH as the potential at the node N13 is inverted by the inverter G15. Each output from the NOR gate G17 and NAND gate G16 is decided according to each potential level of a signal inputted into the other input terminal thereof, namely a potential level at the node N12.

The potential level at the node N12 depends on the potential level of the output signal IN1. When the output signal IN1 is at LOW level, the first NMOS transistor MN1 becomes OFF as input into the gate thereof is LOW. On the other hand, as input into the gate of the second NMOS transistor MN2 is at HIGH level due to the inverter G14, the second NMOS transistor MN2 becomes ON. At that point of time, the first PMOS transistor MP1 becomes ON and the second PMOS transistor MP2 becomes OFF. Therefore, the potential at the node N12 becomes LOW.

Accordingly, the output from the NAND gate G16 becomes HIGH level as each input thereinto is at LOW and HIGH level, and hence the PMOS transistor MP11 becomes OFF. On the other hand, the output from the NOR gate G17 becomes HIGH level as both the inputs thereinto are at LOW level and the NMOS transistor MN11 becomes ON, so that a LOW level signal is outputted to the input/output terminal 4.

When the first control signal IN2 and second control signal IN3 are at HIGH and LOW level respectively, in addition if the output signal IN1 is HIGH, the first NMOS transistor MN1 becomes ON as the input into the gate thereof is at HIGH level.

On the other hand, as input into the gate of the second NMOS transistor MN2 is inverted to a LOW level by the inverter G14, the second NMOS transistor MN2 becomes OFF. Therefore, the potential at the node N12 becomes HIGH.

Accordingly, the output from the NOR gate G17 becomes LOW as each input thereinto is at HIGH and LOW level, and hence the NMOS transistor MN11 becomes OFF. On the other hand, the output from the NAND gate G16 becomes LOW as both the inputs thereinto are at HIGH level, and the PMOS transistor MP11 becomes ON, so that a HIGH level signal is outputted to the input/output terminal 4.

In accordance with Embodiment 1, of the two signals outputted from the signal level converting circuit, one of the signals is inputted into one of input terminals of the NAND gate G16 and NOR gate G17 respectively, while the other signal is inputted into the other input terminal of the NOR gate G17 and also into the other input terminal of the NAND gate G16 after inverted by the inverter G15. Thus, the ON and OFF states of the PMOS transistor MP11 provided at the final stage for output is switched according to a potential level outputted from the NAND gate G16, and the ON and OFF states of the NMOS transistor MN11 provided at the final stage for output is switched according to a potential level outputted from the NOR gate G17. Therefore, it is prevented that the outputs from the NAND gate G16 and NOR gate G17 become LOW and HIGH level respectively, which makes it possible to prevent the PMOS transistor MP11 and the NMOS transistor MN11 from concurrently being turned ON and also to prevent a through current from its flowing therethrough.

Figure 2:
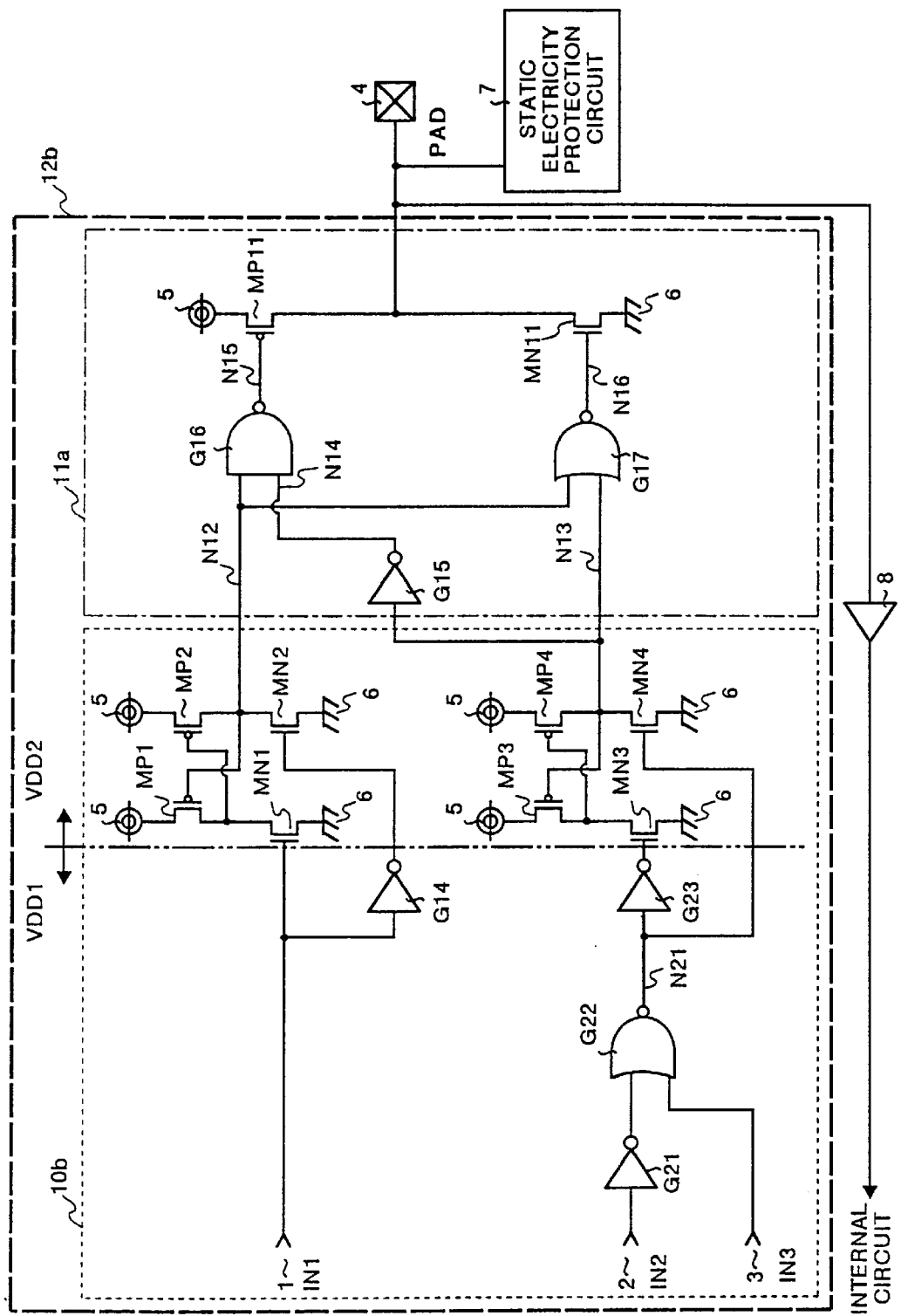
FIG. 2 is a circuit diagram showing Embodiment 2 of the input/output circuit according to the present invention.

FIG. 2 is a circuit diagram showing Embodiment 2 of the input/output circuit according to the present invention. This input/output circuit is different from that of Embodiment 1 shown in FIG. 1 in that an input circuit section 10b (a circuit section enclosed with a dotted line) is provided therein in place of the input circuit section 10a in FIG. 1. In the input circuit section 10b, two inverters G21, G23 and one double-input NOR gate G22 are provided in the VDD1 circuit in place of the inverters G11, G13 and the NAND gate G12 of the input circuit section 10a in FIG. 1.

The first control signal IN2 inputted from the internal circuit through the first control terminal 2 is inputted into the inverter G21. Output signal from the inverter G21 is inputted into the NOR gate G22 together with a second control signal IN3 inputted from an internal circuit through the second control terminal 3. Output signal (namely, potential at the node N21) from the NOR gate G22 is inputted into the gate of the fourth NMOS transistor MN4 and also into the gate terminal of the third NMOS transistor MN3 after inverted by the inverter G23. It should be noted that the configuration of the input/output circuit other than what is described above is the same as those in Embodiment 1, so that the same reference numerals are assigned to the sections corresponding to those in Embodiment 1 and description thereof is omitted herein.

In Embodiment 2, each gate insulating film of MOS transistors constituting the VDD2 circuit is formed such that each of the films is thicker than each gate insulating film of MOS transistors each constituting two inverters G21 and G23, and the NOR gate G22 respectively, with which occurrence of dielectric breakdown is prevented.

Next description is made for effects of the input/output circuit shown in FIG. 2 separately in an input mode and an output mode thereof.

[Input Mode]

When the first control signal IN2 is at LOW level, the signal is inverted to a HIGH level by the inverter G21, so that output from the NOR gate G22 (namely, potential at the node N21) is always at a LOW level regardless of the level of the second control signal IN3. As the potential at the node N21 is inverted by the inverter G23 to a HIGH level, the third NMOS transistor MN3 becomes ON, the fourth NMOS transistor MN4 becomes OFF, the third PMOS transistor MP3 becomes OFF and the fourth PMOS transistor MP4 becomes ON. Namely, potentials at the node N13 and node N14 becomes HIGH and LOW level respectively, which is the same state as that when the first control signal IN2 is at LOW level in Embodiment 1.

Accordingly, both the PMOS transistor MP11 and NMOS transistor MP11 in the output circuit section 11a becomes OFF, and the output buffer circuit 12b enters in a high impedance state with respect to the input/output terminal 4, so that a signal sent from an external device to the input/output terminal 4 can be delivered to the input buffer circuit 8 without loss.

When the second control signal IN3 is at HIGH level, the potential at the node N21 is always at LOW level regardless of the level of the first control signal IN2, and hence the output buffer circuit 12b enters in a high impedance state with respect to the input/output terminal 4 regardless of the level of the output signal IN1, so that a signal sent from an external device to the input/output terminal 4 can be delivered to the input buffer circuit 8 without loss.

[Output Mode]

When the first control signal IN2 is at HIGH level and the second control signal IN2 is at LOW level, both the inputs into the NOR gate G22 are at LOW level, so that potential at the node N21 becomes HIGH. Accordingly, input into the gate of the third NMOS transistor MN3 becomes LOW because of the inversion by the inverter G23, while input into the gate of the fourth NMOS transistor MN4 becomes HIGH. Hence, the third NMOS transistor MN3 and the fourth PMOS transistor MP4 become OFF, and the fourth NMOS transistor MP4 and the third PMOS transistor MP3 become ON.

Namely, the potentials at the node N13 and node N14 is at LOW and HIGH level respectively, which is the same state as that when the first control signal IN2 is at HIGH level and the second control signal IN3 is at LOW level in Embodiment 1.

Accordingly, similarly to Embodiment 1, when the output signal IN1 is at LOW level, the PMOS transistor MP11 becomes OFF and NMOS transistor MN11 becomes ON, so that a LOW level signal is outputted to the input/output terminal 4. On the other hand, when the output signal IN1 is at HIGH level, the PMOS transistor MP11 becomes ON and NMOS transistor MN11 becomes OFF, so that a HIGH level signal is outputted to the input/output terminal 4.

In accordance with Embodiment 2, similarly to Embodiment 1, it is prevented that outputs from the NAND gate G16 and NOR gate G17 become LOW and HIGH level respectively, which makes it possible to prevent the PMOS transistor MP11 and the NMOS transistor MN11 from concurrently being turned ON and also to prevent a through current from its flowing therethrough.

Figure 3:
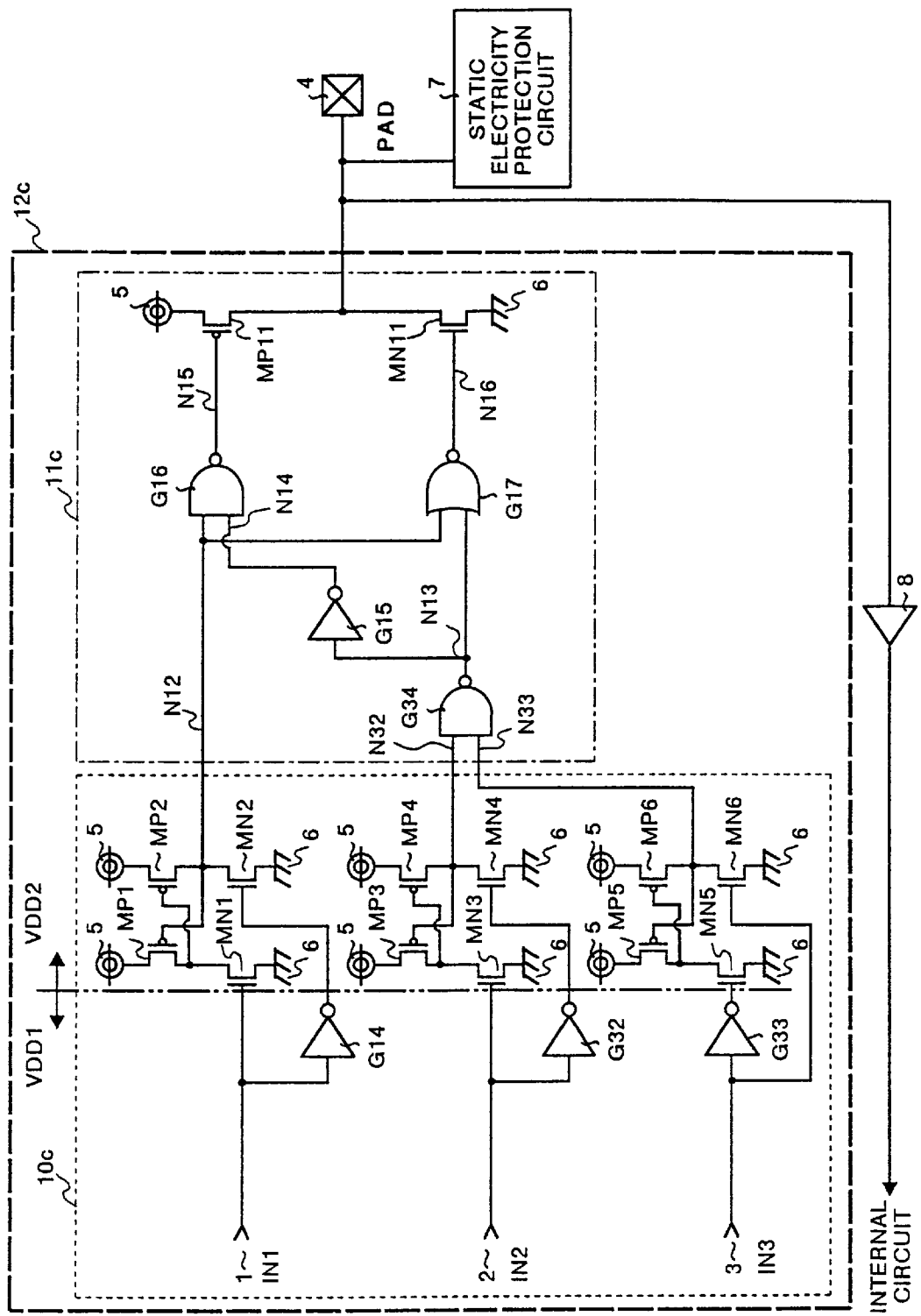
FIG. 3 is a circuit diagram showing Embodiment 3 of the input/output circuit according to the present invention.

FIG. 3 is a circuit diagram showing Embodiment 3 of the input/output circuit according to the present invention. This input/output circuit is different from that of Embodiment 1 shown in FIG. 1 in that an input circuit section 10c (a circuit section enclosed with a dotted line) and an output circuit section 11c (a circuit section enclosed with a dot and dash line) are provided therein in place of the input circuit section 10a and output circuit section 11a in FIG. 1.

In the input circuit section 10c, there is provided a signal level converting circuit, comprising the fifth PMOS transistor MP5; fifth NMOS transistor MN5; sixth PMOS transistor MP6; and the sixth NMOS transistor MN6, which is similar to the signal level converting circuit comprising the third PMOS transistor MP3; third NMOS transistor MN3; fourth PMOS transistor MP4; and the fourth NMOS transistor MN4 in place of the inverter G11, G13 and the NAND gate G12 each of the input circuit section 10a in FIG. 1.

The first control signal IN2 inputted from the internal circuit through the first control terminal 2 is inputted into the gate of the third NMOS transistor MN3 and also into the gate of the fourth NMOS transistor MN4 after inverted by an inverter G32. The second control signal IN3 inputted from the internal circuit through the second control terminal 3 is inputted into the gate of the sixth NMOS transistor MN6 and also into the gate terminal of the fifth NMOS transistor MN5 after inverted by an inverter G33.

In the output circuit section 11c, a double-input NAND gate G34 is provided at a stage previous to the inverter G15 and NOR gate G17, and output from the drain of the fourth PMOS transistor MP4 (or the fourth NMOS transistor MN4) and the drain of the sixth PMOS transistor MP6 (or the sixth NMOS transistor MN6) are inputted into the NAND gate G34. It should be noted that the configuration of the input/output circuit other than what is described here is the same as those in Embodiment 1, so that the same reference numerals are assigned to the sections corresponding to those in Embodiment 1 and description thereof is omitted herein.

In Embodiment 3, each gate insulating film of MOS transistors constituting the VDD2 circuit including the fifth PMOS transistor MP5, fifth NMOS transistor MN5, sixth PMOS transistor MP6, sixth NMOS transistor MN6 and NAND gate G34 respectively is formed so that each of the films is thicker than each gate insulating film of MOS transistors each constituting the three inverters G14, G32 and G33 respectively, with which occurrence of dielectric breakdown is prevented.

Next description is made for effects of the input/output circuit configured as shown in FIG. 3 separately in an input mode and an output mode thereof.

[Input Mode]

When the first control signal IN2 is at LOW level, the third NMOS transistor MN3 and the fourth PMOS transistor MP4 both become OFF, while the fourth NMOS transistor MN4 and the third PMOS transistor MP3 both become ON. Accordingly, as output from the drain of the fourth NMOS transistor MN4 (namely, potential at the node N32) becomes LOW, output from the NAND gate G34 namely the potential at the node N13 is always at HIGH level regardless of the level of the second control signal IN3.

Namely, the potentials at the node N13 and node N14 become HIGH and LOW level respectively, which is the same state as that when the first control signal IN2 is at LOW level in Embodiment 1, and hence the PMOS transistor MP11 and NMOS transistor MN11 in the output circuit section 11c both become OFF. Accordingly, the output buffer circuit 12c enters in a high impedance state with respect to the input/output terminal 4, so that a signal sent from an external device to the input/output terminal 4 can be delivered to the input buffer circuit 8 without loss.

When the second control signal IN3 is at HIGH level, the fifth NMOS transistor MN5 and the sixth PMOS transistor MP6 both becomes OFF, while the sixth NMOS transistor MN6 and the fifth PMOS transistor MP5 both become ON. Accordingly, as output from the drain of the sixth NMOS transistor MN6 (namely, potential at the node N33) becomes LOW, the potential at the node N13 is always at a HIGH level regardless of the level of the first control signal IN2.

In this case also, the PMOS transistor MP11 and NMOS transistor MN11 in the output circuit section 11c become OFF, and the output buffer circuit 12c enters in a high impedance state with respect to the input/output terminal 4, so that a signal sent from an external device to the input/output terminal 4 can be delivered to the input buffer circuit 8 without loss.

[Output Mode]

When the first control signal IN2 is at HIGH level and the second control signal IN2 is at LOW level, the fourth PMOS transistor MP4 and the sixth PMOS transistor MP6 both become ON, and the potentials at the node N32 and node N33 become HIGH, so that the potentials at the node N13 and node N14 become LOW and HIGH level respectively. Namely, the state described above is the same as that when the first control signal IN2 is at HIGH level and second control signal IN3 is LOW in Embodiment 1.

Accordingly, similarly to Embodiment 1, when the output signal IN1 is at LOW level, the PMOS transistor MP11 becomes OFF and NMOS transistor MN11 becomes ON, so that a LOW level signal is outputted to the input/output terminal 4. On the other hand, when the output signal IN1 is at HIGH level, the PMOS transistor MP11 becomes ON and NMOS transistor MN11 becomes OFF, so that a HIGH level signal is outputted to the input/output terminal 4.

In accordance with Embodiment 3, similarly to Embodiment 1, it is prevented that outputs from the NAND gate G16 and NOR gate G17 become LOW and HIGH level respectively, which makes it possible to prevent the PMOS transistor MP11 and the NMOS transistor MN11 from concurrently being turned ON and also to prevent a through current from its flowing therethrough.

Figure 4:
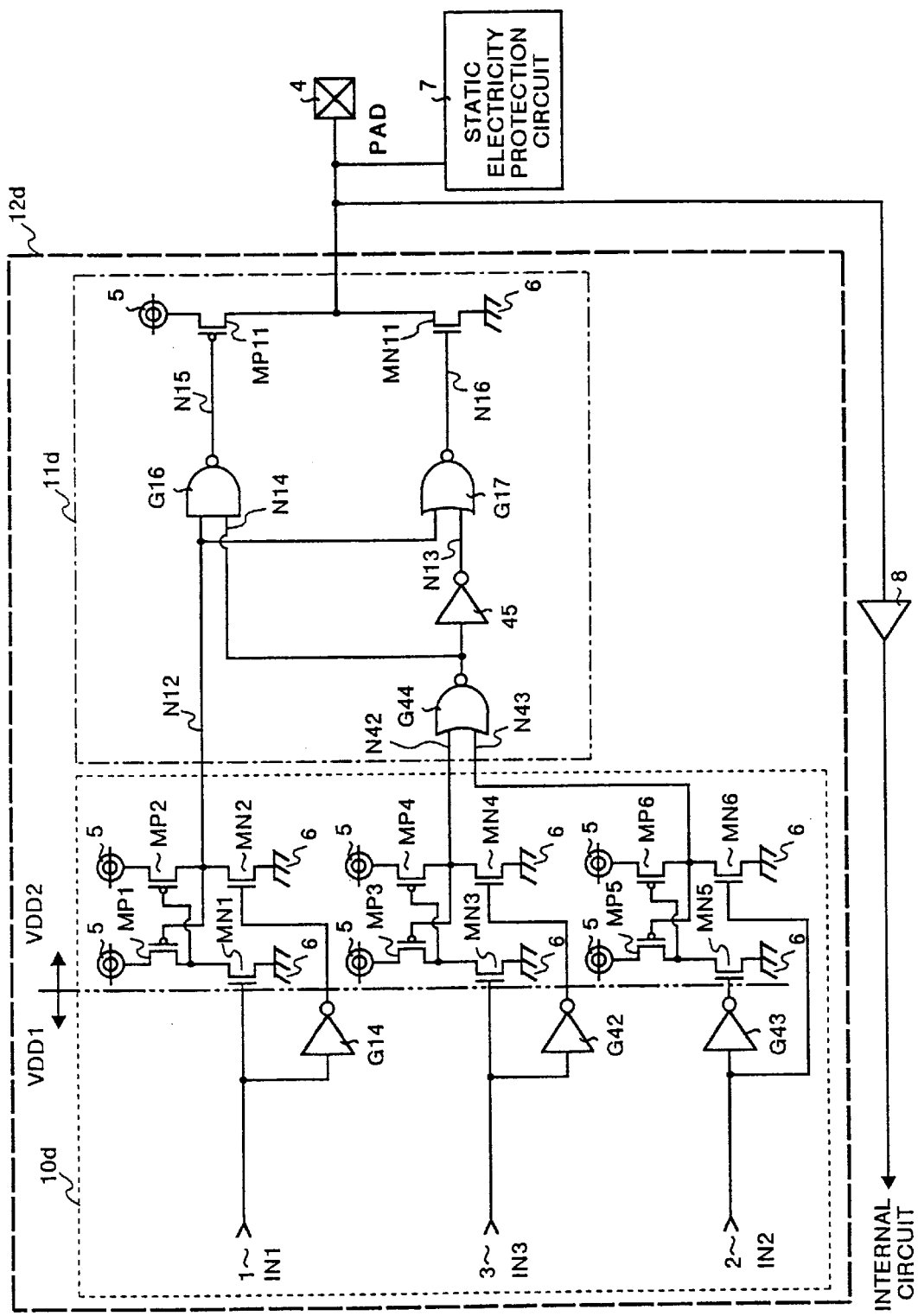
FIG. 4 is a circuit diagram showing Embodiment 4 of the input/output circuit according to the present invention.

FIG. 4 is a circuit diagram showing Embodiment 4 of the input/output circuit according to the present invention. This input/output circuit is different from that of Embodiment 1 shown in FIG. 1 in that an input circuit section 10d (a circuit section enclosed with a dotted line) and an output circuit section 11d (a circuit section enclosed with a dot and dash line) are provided therein in place of the input circuit section 10a and output circuit section 11a in FIG. 1.

In the input circuit section 10d, there is provided a signal level converting circuit, comprising the fifth PMOS transistor MP5; fifth NMOS transistor MN5; sixth PMOS transistor MP6; and the sixth NMOS transistor MN6, which is similar to the signal level converting circuit comprising the third PMOS transistor MP3; third NMOS transistor MN3; fourth PMOS transistor MP4; and the fourth NMOS transistor MN4 in place of the inverter G11, G13 and the NAND gate G12 each of the input circuit section 10a in FIG. 1.

The first control signal IN2 inputted from the internal circuit through the first control terminal 2 is inputted into the gate of the sixth NMOS transistor MN6 and also into the gate of the fifth NMOS transistor MN5 after inverted by an inverter G43. The second control signal IN3 inputted from the internal circuit through the second control terminal 3 is inputted into the gate of the third NMOS transistor MN3 and also into the gate of the fourth NMOS transistor MN4 after inverted by an inverter G42.

In the output circuit section 11d, a double-input NOR gate G44 and an inverter G45 are provided in place of the inverter G15, and output from the drain of the fourth PMOS transistor MP4 (or the fourth NMOS transistor MN4) and the drain of the sixth PMOS transistor MP6 (or the sixth NMOS transistor MN6) is inputted into the NOR gate G44. Output from the NOR gate G44 (namely, potential at the node N14) together with output from the drain of the second PMOS transistor MP2 (or the second NMOS transistor MN2) is inputted into the NAND gate G16.

The output from the NOR gate G44 is inverted by the inverter G45, and the output therefrom (namely, potential at the node N13) together with the output from the drain of the second PMOS transistor MP2 (or the second NMOS transistor MN2) is inputted into the NOR gate G17. It should be noted that the configuration of the input/output circuit other than what is described here is the same as those in Embodiment 1, so that the same reference numerals are assigned to the sections corresponding to those in Embodiment 1 and description thereof is omitted herein.

In Embodiment 4, each gate insulating film of MOS transistors constituting the VDD2 circuit including the fifth PMOS transistor MP5, fifth NMOS transistor MN5, sixth PMOS transistor MP6, sixth NMOS transistor MN6, NOR gate G44 and inverter G45 respectively is formed such that each of the films is thicker than each gate insulating film of MOS transistors each constituting the three inverters G14, G42 and G43 respectively, with which occurrence of dielectric breakdown is prevented.

Next description is made for effects of the input/output circuit configured as shown in FIG. 4 separately in an input mode and an output mode thereof.

[Input Mode]

When the first control signal IN2 is at LOW level, the fifth NMOS transistor MN5 and the sixth PMOS transistor MP6 both become ON, while the sixth NMOS transistor MN6 and the fifth PMOS transistor MP5 both become OFF. Accordingly, as output from the drain of the sixth PMOS transistor MP6 (namely, potential at the node N43) becomes HIGH, output from the NOR gate G44 namely the potential at the node N14 is always at a LOW level regardless of the level of the second control signal IN3.

At that point of time, potential at the node N13 is inverted to HIGH level by the inverter G45. Namely the state described above is the same as that when the first control signal IN2 is LOW in Embodiment 1, and hence the PMOS transistor MP11 and NMOS transistor MN11 in the output circuit section 11d become OFF. Accordingly, the output buffer circuit 12d enters in a high impedance state with respect to the input/output terminal 4, so that a signal sent from an external device to the input/output terminal 4 can be delivered to the input buffer circuit 8 without loss.

When the second control signal IN3 is at HIGH level, the third NMOS transistor MN3 and the fourth PMOS transistor MP4 both become ON, while the fourth NMOS transistor MN4 and the third PMOS transistor MP3 both become OFF. Accordingly, as output from the drain of the fourth PMOS transistor MP4 (namely, potential at the node N42) becomes HIGH, the potential at the node N14 is always at a LOW level regardless of the level of the first control signal IN2.

The potential at the node N13 is inverted to a HIGH level by the inverter G45. In this case, the PMOS transistor MP11 and NMOS transistor MN11 in the output circuit section 11d both become OFF, and the output buffer circuit 12d enters in a high impedance state with respect to the input/output terminal 4, so that a signal sent from an external device to the input/output terminal 4 can be delivered to the input buffer circuit 8 without loss.

[Output Mode]

When the first control signal IN2 is at HIGH level and the second control signal IN2 is at LOW level, the fourth NMOS transistor MN4 and the sixth NMOS transistor MN6 both become ON, and the potentials of the node N42 and node N43 becomes LOW, so that potentials of the node N13 and node N14 become LOW and HIGH level respectively. Namely, the state described above is the same as that when the first control signal IN2 is at HIGH level and second control signal IN3 is at LOW level in Embodiment 1.

Accordingly, similarly to Embodiment 1, when the output signal IN1 is at LOW level, the PMOS transistor MP11 becomes OFF and NMOS transistor MN11 becomes ON, so that a LOW level signal is outputted to the input/output terminal 4. On the other hand, when the output signal IN1 is at HIGH level, the PMOS transistor MP11 becomes ON and NMOS transistor MN11 becomes OFF, so that a HIGH level signal is outputted to the input/output terminal 4.

In accordance with Embodiment 4, similarly to Embodiment 1, it is prevented that outputs from the NAND gate G16 and NOR gate G17 become LOW and HIGH level respectively, which makes it possible to prevent the PMOS transistor MP11 and the NMOS transistor MN11 from concurrently being turned ON and also to prevent a through current from its flowing therethrough.

Figure 5:
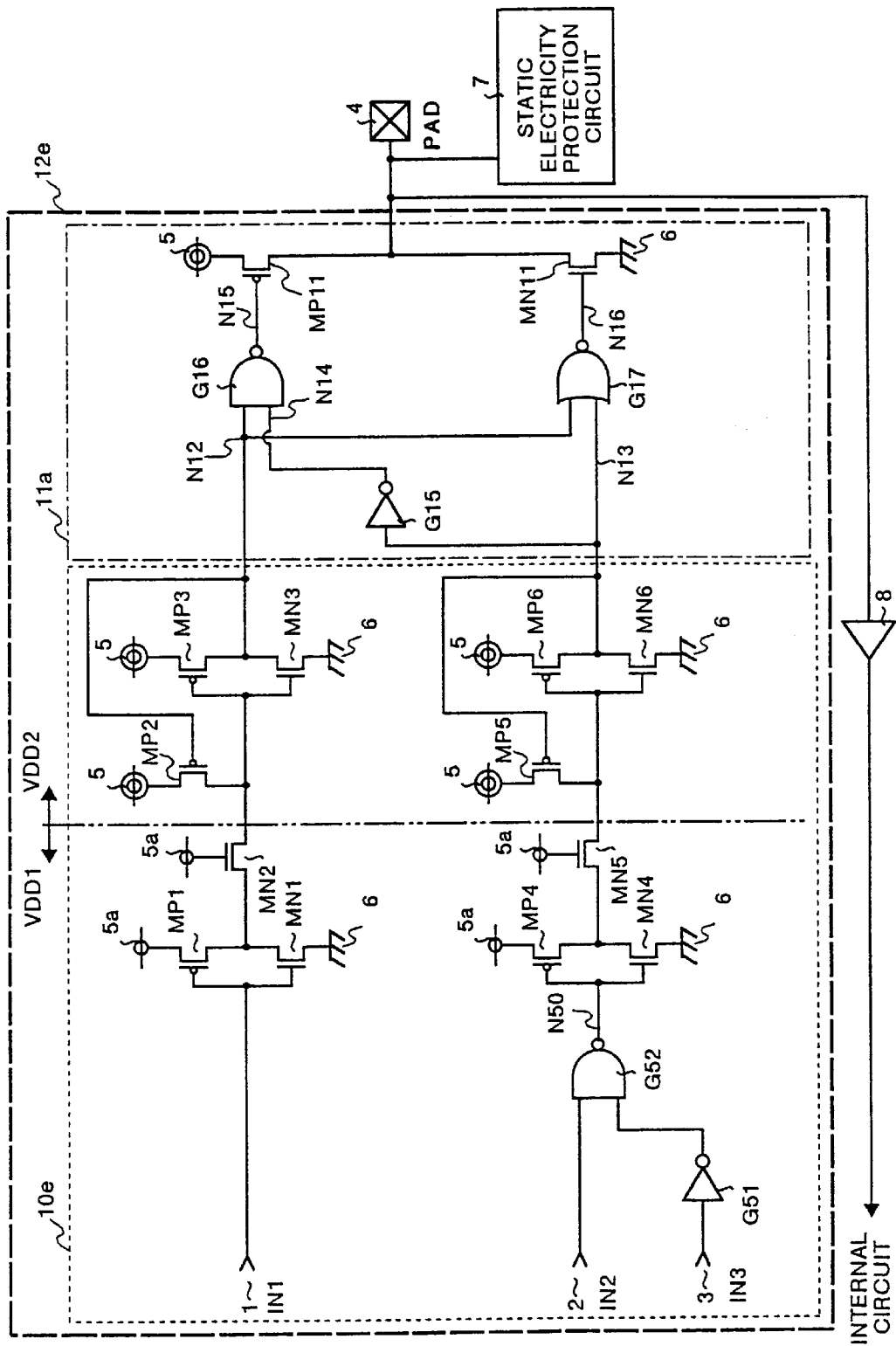
FIG. 5 is a circuit diagram showing Embodiment 5 of the input/output circuit according to the present invention.

FIG. 5 is a circuit diagram showing Embodiment 5 of the input/output circuit according to the present invention. This input/output circuit is different from that of Embodiment 1 shown in FIG. 1 in that an input circuit section 10e (a circuit section enclosed with a dotted line) is provided therein in place of the input circuit section 10a in FIG. 1. The input circuit section 10e comprises an input terminal 1 for receiving an output signal IN1; a first control terminal 2 for receiving a first control signal IN2; a second control terminal 3 for receiving a second control signal IN3; an inverter G51; a double-input NAND gate G52; six PMOS transistors MP1, MP2, MP3, MP4, MP5 and MP6; and six NMOS transistors MN1, MN2, MN3, MN4, MN5 and MN6.

In this input circuit section 10e, the four PMOS transistors MP2, MP3, MP5 and MP6 and two NMOS transistors MN3 and MN6 are included in the VDD2 circuit, and the other transistors and gates are included in the VDD1 circuit. It should be noted that the reference numeral 5a in FIG. 5 indicates a first power supply terminal of the power supply potential VDD1.

The second control signal IN3 inputted from the internal circuit through the second control terminal 3 is inputted into the inverter G51. An output signal from the inverter G51 is inputted into the NAND gate G52 together with a first control signal IN2 inputted from an internal circuit through the first control terminal 2. Output signal (namely, potential at the node N50) from the NAND gate G52 is inputted into the gates of the fourth PMOS transistor MP4 and the fourth NMOS transistor MN4.

The fourth PMOS transistor MP4 and the fourth NMOS transistor MN4 constitute a CMOS structure, and their drains are commonly connected to the source of the fifth NMOS transistor MN5. The sources of the fourth PMOS transistor MP4 and the fourth NMOS transistor MN4 are connected to the first power supply terminal 5a and the ground terminal 6 respectively. The gate of the fifth NMOS transistor MN5 is connected to the first power supply terminal 5a, and the drain thereof together with the drain of the fifth PMOS transistor MP5 is connected to the commonly connected gates of the sixth PMOS transistor MP6 and sixth NMOS transistor MN6.

The source of the fifth PMOS transistor MP5 is connected to the second power supply terminal 5, and the gate is connected to the commonly connected drains of the sixth PMOS transistor MP6 and sixth NMOS transistor MN6 as well as to the output circuit section 11a. The sixth PMOS transistor MP6 and sixth NMOS transistor MN6 constitute a CMOS structure, and their sources are connected to the second power supply terminal 5 and the ground terminal 6 respectively, and an output signal therefrom is inputted into the inverter G15 and the NOR gate G17. A set of transistors with those MP4, MP5, MP6, MN4, MN5 and MN6 constitutes a signal level converting circuit.

On the other hand, an output signal IN1 inputted from the internal circuit through the input terminal 1 is inputted to gates of the first PMOS transistor MP1 and first NMOS transistor MN1 constituting a CMOS structure respectively. The drains of the first PMOS transistor MP1 and first NMOS transistor MN1 are commonly connected to the source of the second NMOS transistor MN2. The sources of the first PMOS transistor MP1 and first NMOS transistor MN1 are connected to the first power supply terminal 5a and the ground terminal 6 respectively. The gate of the second NMOS transistor MN2 is connected to the first power supply terminal 5a, and the drain together with the drain of the second PMOS transistor MP2 is connected to the commonly connected gates of the third PMOS transistor MP3 and third NMOS transistor MN3 constituting a CMOS structure.

The source of the second PMOS transistor MP2 is connected to the second power supply terminal 5, and the gate is connected to the commonly connected drains of the third PMOS transistor MP3 and third NMOS transistor MN3 as well as to the output circuit section 11a. The sources of the third PMOS transistor MP3 and third NMOS transistor MN3 are connected to the second power supply terminal 5 and the ground terminal 6 respectively, and an output signal therefrom is inputted into the NAND gate G16 and NOR gate G17. A set of transistors with those MP1, MP2, MP3, MN1, MN2 and MN3 constitutes a signal level converting circuit.

In Embodiment 5, each gate insulating film of the four PMOS transistors MP2, MP3, MP5 and MP6, two NMOS transistors MN2 and MN6 each in the input circuit section 10e is formed such that each of the films is thicker than each gate insulating film of MOS transistors, together with MOS transistors included in the output circuit section 11a, each constituting the two PMOS transistors MP1 and MP4, four NMOS transistors MN1, MN2, MN4 and MN5, inverter G51, and NAND gate G52 respectively, with which occurrence of dielectric breakdown is prevented. It should be noted that the configuration of the output circuit section 11a is the same as that in Embodiment 1, so that the same reference numerals are assigned to the sections corresponding to those in Embodiment 1 and description thereof is omitted herein.

Next, description is made for effects of the input/output circuit configured as shown in FIG. 5 separately in an input mode and an output mode thereof.

[Input Mode]

When the first control signal IN2 is at LOW level, output from the NAND gate G52 (namely, potential at the node N50) is always at a HIGH level regardless of the level of the second control signal IN3. Accordingly, the fourth PMOS transistor MP4 becomes OFF and the fourth NMOS transistor MN4 becomes ON, and as the output therefrom is at LOW level the sixth PMOS transistor MP6 becomes ON and the sixth NMOS transistor MN6 becomes OFF. Therefore, the output therefrom, namely the potential at the node N13 becomes HIGH, which is inverted by the inverter G15, so that the potential at the node N14 becomes LOW. This state is the same as that when the first control signal IN2 is at LOW level in Embodiment 1.

Accordingly, the PMOS transistor MP11 and NMOS transistor MN11 in the output circuit section 11a both become OFF, and the output buffer circuit 12e enters in a high impedance state with respect to the input/output terminal 4, so that a signal sent from an external device to the input/output terminal 4 can be delivered to the input buffer circuit 8 without loss.

When the second control signal IN3 is at HIGH level, the signal is inverted to a LOW level by the inverter G51, so that the potential at the node N50 is always at a HIGH level regardless of the level of the first control signal IN2. Hence, the output buffer circuit 12e enters in a high impedance state with respect to the input/output terminal 4 regardless of the level of the output signal IN1, and a signal sent from an external device to the input/output terminal 4 can be delivered to the input buffer circuit 8 without loss.

[Output Mode]

When the first control signal IN2 is at HIGH level and the second control signal IN2 is at LOW level, both the inputs into the NAND gate G52 are at HIGH level, so that the potential at the node N50 becomes LOW. Accordingly, a LOW level signal is inputted into the gate of the fourth PMOS transistor MP4, while a HIGH level signal is inputted into the gate of the sixth NMOS transistor MN6, and hence the fourth PMOS transistor MP4 and the sixth NMOS transistor MN6 both become ON. Namely, the potentials of the node N13 and node N14 become LOW and HIGH level respectively, which is the same state as that when the first control signal IN2 is at HIGH level and the second control signal IN3 is at LOW level in Embodiment 1.

Accordingly, similarly to Embodiment 1, each output from the NOR gate G17 and NAND gate G16 depends on the potential level at the node N12 which is decided by the potential level of the output signal IN1. When the output signal IN1 is at LOW level, a LOW level signal is inputted into the gate of the first PMOS transistor MP1 and a HIGH level signal is inputted into the gate of the third NMOS transistor MN3, so that the first PMOS transistor MP1 and third NMOS transistor MN3 are both turned ON. Accordingly, the potential of the node N12 becomes LOW.

At this point of time, as each output from the NOR gate G17 and NAND gate G16 becomes HIGH, the PMOS transistor MP11 becomes OFF and NMOS transistor MN11 becomes ON, and a LOW level signal is outputted to the input/output terminal 4. On the other hand, when the output signal IN1 is at HIGH level the PMOS transistor MP11 becomes ON and NMOS transistor MN11 becomes OFF, so that a HIGH level signal is outputted to the input/output terminal 4.

In accordance with Embodiment 5, similarly to Embodiment 1, it is prevented that outputs from the NAND gate G16 and NOR gate G17 enter in a LOW and HIGH level respectively, which makes it possible to prevent the PMOS transistor MP11 and the NMOS transistor MN11 from concurrently being turned ON and also to prevent a through current from its flowing therethrough.

Figure 6:
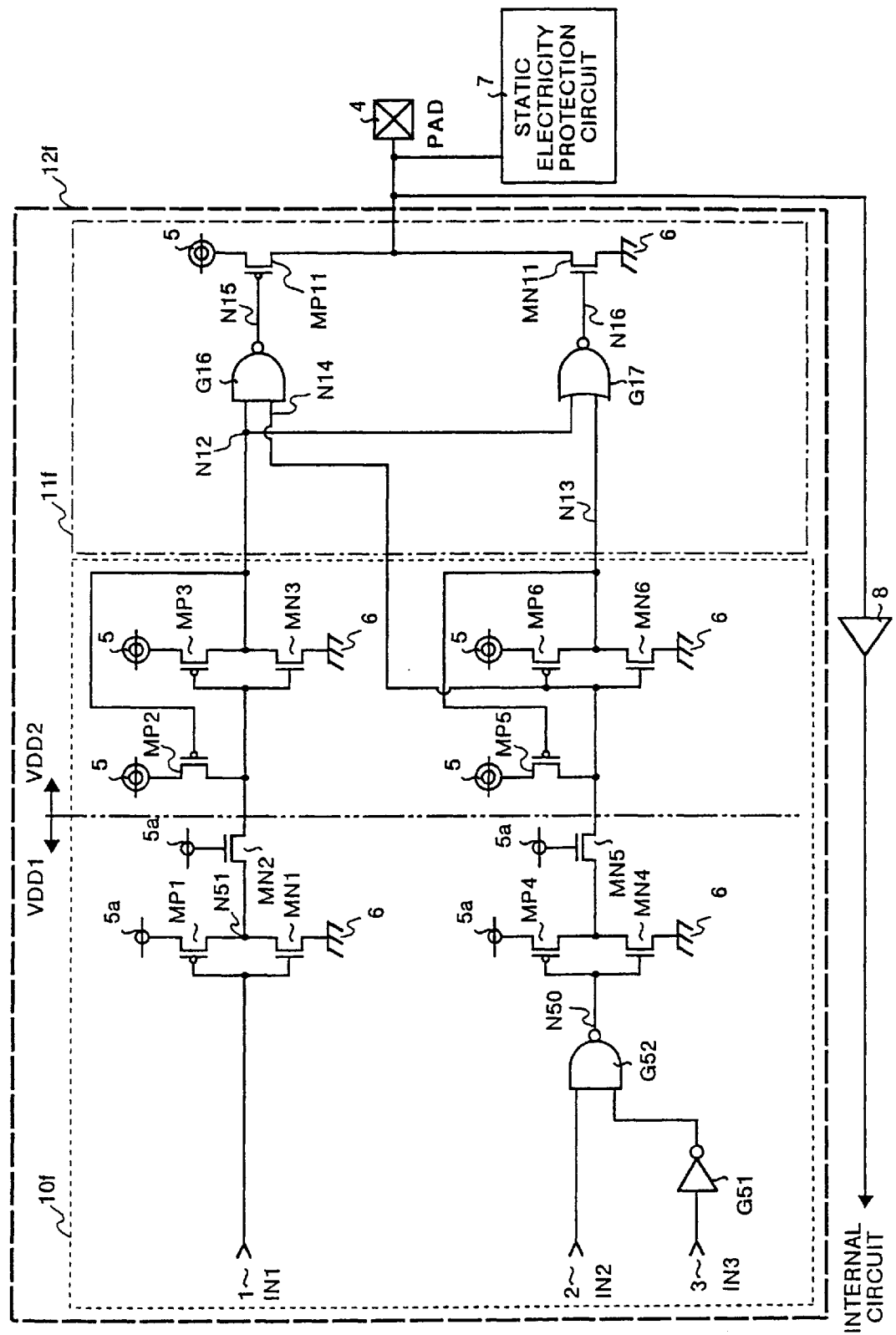
FIG. 6 is a circuit diagram showing Embodiment 6 of the input/output circuit according to the present invention.
Figure 7:
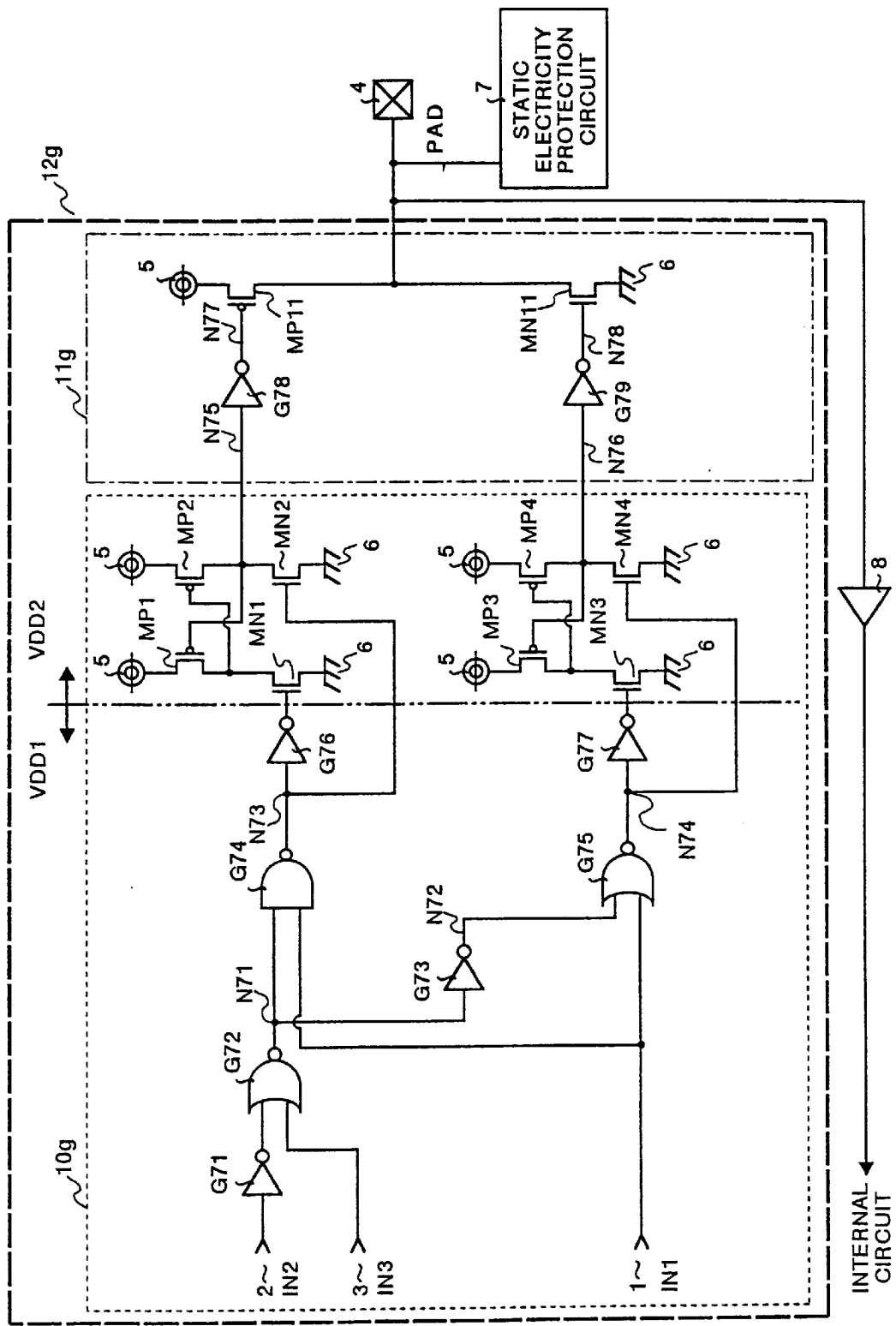
FIG. 7 is a circuit diagram showing a configuration of an input/output circuit based on the conventional technology.

FIG. 6 is a circuit diagram showing Embodiment 6 of the input/output circuit according to the present invention. This input/output circuit is realized in such a way that the inverter G15 is removed from the output circuit section 11a of Embodiment 5 in FIG. 5, and that, in place of an output signal from the inverter G15, an input signal into a CMOS structure comprising the sixth PMOS transistor MP6 and sixth NMOS transistor MN6 in an input circuit section 10f (a circuit section enclosed with a dotted line) is inputted into the NAND gate G16 in an output circuit section 11f (a circuit section enclosed with a dot and dashed line). Remaining configuration is the same as that in Embodiment 5, so that detailed description thereof is omitted herein.

Next, description is made for effects of the input/output circuit configured as shown in FIG. 8 separately in an input mode and an output mode thereof.

[Input Mode]

When the first control signal IN2 is at LOW level, output from the NAND gate G52 (namely, potential at the node N50) is always at a HIGH level regardless of the level of the second control signal IN3. Accordingly, the fourth PMOS transistor MP4 becomes OFF and fourth NMOS transistor MN4 becomes ON, and as the output therefrom (namely, potential at the node N50) is at LOW level the sixth PMOS transistor MP6 becomes ON and sixth NMOS transistor MN6 becomes OFF. Therefore, the output therefrom, namely the potential at the node N13 becomes HIGH. This state is the same as that when the first control signal IN2 is at LOW level in Embodiment 5 (and likewise in Embodiment 1).

Accordingly, the PMOS transistor MP11 and NMOS transistor MN11 in the output circuit section 11f both become OFF, and the output buffer circuit 12f enters in a high impedance state with respect to the input/output terminal 4, so that a signal sent from an external device to the input/output terminal 4 can be delivered to the input buffer circuit 8 without loss.

When the second control signal IN3 is at HIGH level, the signal is inverted to a LOW level by the inverter G51, so that the potential at the node N50 is always at a HIGH level regardless of the level of the first control signal IN2. Hence, the output buffer circuit 12f enters in a high impedance state with respect to the input/output terminal 4 regardless of the level of the output signal IN1, and a signal sent from an external device to the input/output terminal 4 can be delivered to the input buffer circuit 8 without loss.

[Output Mode]

When the first control signal IN2 is at HIGH level and the second control signal IN2 is at LOW level, a HIGH level signal is inputted into both the inputs of the NAND gate G52, so that the potential at the node N50 becomes LOW. Accordingly, a LOW level signal is inputted into the gate of the fourth PMOS transistor MP4, while a HIGH level signal is inputted into the gate of the sixth NMOS transistor MN6, and hence both the fourth PMOS transistor MP4 and the sixth NMOS transistor MN6 become ON. Namely, the potentials at the node N13 and node N14 become LOW and HIGH level respectively, which is the same state as that when the first control signal IN2 is at HIGH level and the second control signal IN3 is at LOW level in Embodiment 5 (and likewise in Embodiment 1).

Accordingly, similarly to Embodiment 5 (or Embodiment 1), each output from the NOR gate G17 and NAND gate G16 depends on the potential level at the node N12 which is decided by the potential level of the output signal IN1. When the output signal IN1 is at LOW level, a LOW level signal is inputted into the gate of the first PMOS transistor MP1 and a HIGH level signal is inputted into the gate of the third NMOS transistor MN3, so that both the first PMOS transistor MP1 and third NMOS transistor MN3 are turned ON. Accordingly, the potential of the node N12 becomes LOW.

At this point of time, as each output from the NOR gate G17 and NAND gate G16 are HIGH, the PMOS transistor MP11 becomes OFF and NMOS transistor MN11 becomes ON, and a LOW level signal is outputted to the input/output terminal 4. On the other hand, when the output signal IN1 is at HIGH level, the PMOS transistor MP11 becomes ON and NMOS transistor MN11 becomes OFF, so that a HIGH level signal is outputted to the input/output terminal 4.

In accordance with Embodiment 6, similarly to Embodiment 5 (namely, Embodiment 1), it is prevented that outputs from the NAND gate G16 and NOR gate G17 become LOW and HIGH level respectively, which makes it possible to prevent the PMOS transistor MP11 and the NMOS transistor MN11 from concurrently being turned ON and also to prevent a through current from its flowing therethrough.

It should be noted that, in the present invention, the front-stage circuit section of the signal level converting circuit in the input circuit section, the signal level converting circuit, and the circuit in the final stage for output are not limited to the configuration in each of the embodiments described above.

In accordance with the present invention, when the second signal outputted from the signal level converting circuit is HIGH, outputs from a NAND gate and a NOR gate become HIGH and LOW respectively regardless of the potential level of a first signal outputted from the signal level converting circuit, and both a first output element and a second output element have a high impedance. When the second signal is LOW and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level. Therefore, it is possible to prevent the first output element and second output element from concurrently entering into a outputting state, so that a through current can be prevented from its flowing through an output stage consisting of the first output element and second output element.

In accordance with another aspect of the present invention, when at least one of the second signal and the third signal outputted from a signal level converting circuit is LOW, outputs from a NAND gate and a NOR gate become HIGH and LOW respectively regardless of the potential level of the first signal outputted from the signal level converting circuit, and the first output element and the second output element both have a high impedance. When the second signal and third signal are both HIGH and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level. Therefore, it is possible to prevent the first output element and second output element from concurrently entering into a outputting state, so that a through current can be prevented from its flowing through an output stage consisting of the first output element and second output element.

In accordance with another aspect of the present invention, when at least one of the second signal and the third signal outputted from a signal level converting circuit is HIGH, outputs from a NAND gate and a NOR gate become HIGH and LOW respectively regardless of the potential level of the first signal outputted from the signal level converting circuit, and the first output element and the second output element both have a high impedance. When the second signal and third signal are both LOW and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level. Therefore, it is possible to prevent the first output element and second output element from concurrently entering into a outputting state, so that a through current can be prevented from its flowing through an output stage consisting of the first output element and second output element.

In accordance with another aspect of the present invention, when a second signal from the signal level converting circuit is HIGH, namely when the third signal is LOW, outputs from a NAND gate and a NOR gate are HIGH and LOW respectively regardless of a potential level of the first signal outputted from the signal level converting circuit, and the first output element and the second output element both have a high impedance. When the second signal is LOW, namely when the third signal is HIGH, and if the first signal is HIGH, both outputs from the NAND gate and NOR gate are LOW, and only the first output element outputs a signal for a specified potential level, while if the first signal is LOW, both outputs from the NAND gate and NOR gate are HIGH, and only the second output element outputs a signal for a specified potential level. Therefore, it is possible to prevent the first output element and second output element from concurrently entering into a outputting state, so that a through current can be prevented from its flowing through an output stage consisting of the first output element and second output element.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An input/output circuit comprising:
   a signal level converting circuit for converting a signal at a first potential to a signal at a second potential and outputting a first signal at the second potential or a ground potential and a second signal at the second potential or the ground potential;

an inverter for receiving the second signal;

a NAND gate for receiving the first signal and an output signal from said inverter;

a NOR gate for receiving the first signal and the second signal;

a first output element receiving a signal output from said NAND gate, outputting a signal at a third potential when a signal at the ground potential is received, and entering a high impedance state when a signal at the second potential is received; and a second output element receiving a signal output from said NOR gate, outputting a signal at a fourth potential when a signal at the second potential is received, and entering a high impedance state when a signal at the ground potential is received.

2. An input/output circuit comprising:

a signal level converting circuit for converting a signal at a first potential to a signal at a second potential and outputting a first signal at the second potential or a ground potential, a second signal at the second potential or the ground potential, and a third signal at the second potential or the ground potential;

a first NAND gate for receiving the second signal and the third signal;

an inverter for receiving an output signal from said first NAND gate;

a second NAND gate for receiving the first signal and an output signal from said inverter;

a NOR gate for receiving the first signal and an output signal from said first NAND gate;

a first output element receiving a signal output from said second NAND gate, outputting a signal at a third potential when a signal at the ground potential is received, and entering a high impedance state when a signal at the second potential is received; and a second output element receiving a signal output from said NOR gate, outputting a signal at a fourth potential when a signal at the second potential is received, and entering a high impedance state when a signal at the ground potential is received.

3. An input/output circuit comprising:

a signal level converting circuit for converting a signal at a first potential to a signal at a second potential and outputting a first signal at the second potential or a ground potential, a second signal at the second potential or the ground potential, and a third signal at the second potential or the ground potential;

a first NOR gate for receiving the second signal and the third signal;

a NAND gate for receiving the first signal and an output signal from said first NOR gate;

an inverter for receiving an output signal from said first NOR gate;

a second NOR gate for receiving the first signal and an output signal from said inverter;

a first output element receiving a signal output from said NAND gate, outputting a signal at a third potential when a signal at the ground potential is received, and entering a high impedance state when a signal at the second potential is received; and a second output element receiving a signal output from said NOR gate, outputting a signal at a fourth potential when a signal at the second potential is received, and entering a high impedance state when a signal at the ground potential is received.

* * * * *